US009589839B1

(12) United States Patent
Ikawa et al.

(10) Patent No.: US 9,589,839 B1
(45) Date of Patent: Mar. 7, 2017

(54) METHOD OF REDUCING CONTROL GATE ELECTRODE CURVATURE IN THREE-DIMENSIONAL MEMORY DEVICES

(71) Applicant: SANDISK TECHNOLOGIES INC., Plano, TX (US)

(72) Inventors: Yusuke Ikawa, Yokkaichi (JP); Kiyohiko Sakakibara, Yokkaichi (JP); Eisuke Takii, Yokkaichi (JP); Kengo Kajiwara, Yokkaichi (JP); Seiji Shimabukuro, Yokkaichi (JP); Akira Matsudaira, San Jose, CA (US); Hiroyuki Ogawa, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/012,082

(22) Filed: Feb. 1, 2016

(51) Int. Cl.
*H01L 29/792* (2006.01)
*H01L 21/768* (2006.01)
(Continued)

(52) U.S. Cl.
CPC .. *H01L 21/76888* (2013.01); *H01L 21/76816* (2013.01); *H01L 21/76879* (2013.01);
(Continued)

(58) Field of Classification Search
USPC ...... 257/314, E21.423, E21422, E29.3, 315, 257/E21.679, E29.262, E21.21, E21.614,
(Continued)

(56) References Cited

U.S. PATENT DOCUMENTS 5,084,417 A   1/1992   Joshi et al.
5,563,105 A   10/1996  Dobuzinsky et al.
(Continued)

FOREIGN PATENT DOCUMENTS

WO   WO02/15277 A2   2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — Tram H Nguyen
(74) *Attorney, Agent, or Firm* — The Marbury Law Group PLLC

(57) ABSTRACT

Corner rounding of electrically conductive layers in a replacement electrode integration scheme can be alleviated by employing compositionally modulated sacrificial material layers. An alternating stack of insulating layers and compositionally modulated sacrificial material layers can be formed over a substrate. Each of the compositionally modulated sacrificial material layers has a vertical modulation of material composition such that each compositionally modulated sacrificial material layer provides greater resistance to conversion into a silicon-oxide-containing material at upper and lower portions thereof than at a middle portion thereof during a subsequent oxidation process. Bird's beak features can be formed with lesser dimensions, and electrically conductive layers formed by replacement of remaining portions of the sacrificial material layers with a conductive material can have less corner rounding. Reduction in corner rounding can increase effectiveness of the control gates for a three-dimensional memory device.

23 Claims, 20 Drawing Sheets

(51) Int. Cl.
    *H01L 27/115* (2006.01)
    *H01L 23/522* (2006.01)
    *H01L 23/528* (2006.01)

(52) U.S. Cl.
    CPC ...... *H01L 23/5226* (2013.01); *H01L 23/5283* (2013.01); *H01L 27/1157* (2013.01); *H01L 27/11582* (2013.01)

(58) Field of Classification Search
    USPC .......... 257/E21.645, E27.102, E27.111, 257/E29.129, E29.331, E21.312, E21.41, 257/E21.663, E21.07, 758, 288, 298, 521, 257/579, 776, E21.586, 773, 374, 257/499–564, 762, 757; 438/268, 762, 438/639, 643, 687, 637, 485, 785; 365/185.18, 185.17, 185.03, 17, 184, 365/185.22, 185.23, 185.29, 189.14, 51, 365/63
    See application file for complete search history.

(56) References Cited

U.S. PATENT DOCUMENTS

| | | |
|---|---|---|
| 5,807,788 A | 9/1998 | Brodsky et al. |
| 5,915,167 A | 6/1999 | Leedy |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,514,321 B2 | 4/2009 | Mokhlesi et al. |
| 7,575,973 B2 | 8/2009 | Mokhlesi et al. |
| 7,691,442 B2 | 4/2010 | Gandikota et al. |
| 7,745,265 B2 | 6/2010 | Mokhlesi et al. |
| 7,745,312 B2 | 6/2010 | Herner et al. |
| 7,808,038 B2 | 10/2010 | Mokhlesi et al. |
| 7,848,145 B2 | 12/2010 | Mokhlesi et al. |
| 7,851,851 B2 | 12/2010 | Mokhlesi et al. |
| 8,008,710 B2 | 8/2011 | Fukuzumi |
| 8,053,829 B2 | 11/2011 | Kang et al. |
| 8,093,725 B2 | 1/2012 | Wilson |
| 8,187,936 B2 | 5/2012 | Alsmeier et al. |
| 8,193,054 B2 | 6/2012 | Alsmeier |
| 8,198,672 B2 | 6/2012 | Alsmeier |
| 8,283,228 B2 | 10/2012 | Alsmeier |
| 8,349,681 B2 | 1/2013 | Alsmeier et al. |
| 8,658,499 B2 | 2/2014 | Makala et al. |
| 9,401,309 B2 * | 7/2016 | Izumi ............... H01L 21/76816 |
| 9,419,012 B1 * | 8/2016 | Shimabukuro ... H01L 27/11582 |
| 9,466,612 B2 * | 10/2016 | Kim .................. H01L 27/11582 |
| 2007/0210338 A1 | 9/2007 | Orlowski |
| 2007/0252201 A1 | 11/2007 | Kito et al. |
| 2010/0044778 A1 | 2/2010 | Seol |
| 2010/0112769 A1 | 5/2010 | Son et al. |
| 2010/0120214 A1 | 5/2010 | Park et al. |
| 2010/0155810 A1 | 6/2010 | Kim et al. |
| 2010/0155818 A1 | 6/2010 | Cho |
| 2010/0181610 A1 | 7/2010 | Kim et al. |
| 2010/0207195 A1 | 8/2010 | Fukuzumi et al. |
| 2010/0320528 A1 | 12/2010 | Jeong et al. |
| 2011/0076819 A1 | 3/2011 | Kim et al. |
| 2011/0133606 A1 | 6/2011 | Yoshida et al. |
| 2011/0266606 A1 | 11/2011 | Park et al. |
| 2011/0298013 A1 | 12/2011 | Hwang et al. |
| 2012/0001247 A1 | 1/2012 | Alsmeier |
| 2012/0001249 A1 | 1/2012 | Alsmeier |
| 2012/0256247 A1 | 10/2012 | Alsmeier |
| 2013/0248974 A1 | 9/2013 | Alsmeier et al. |
| 2013/0264631 A1 | 10/2013 | Alsmeier et al. |
| 2013/0313627 A1 | 11/2013 | Lee et al. |
| 2014/0008714 A1 | 1/2014 | Makala et al. |
| 2014/0080309 A1 | 3/2014 | Park et al. |
| 2014/0191312 A1 | 7/2014 | Kim et al. |
| 2014/0220750 A1 | 8/2014 | Sohn et al. |
| 2014/0225181 A1 | 8/2014 | Makala et al. |
| 2014/0332873 A1 | 11/2014 | Yoo |
| 2015/0340274 A1 | 11/2015 | Ryan et al. |
| 2016/0284726 A1 * | 9/2016 | Sakakibara ....... H01L 27/11582 |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

J. Ooshita, Toshiba Announces 32Gb 3D-Stacked Multi-Level NAND Flash, 3 pages, http://techon.nikkeibp.co.ip/english/NEWS_EN/20090619/171977/ Nikkei Microdevices, Tech-On, Jun. 19, 2009.

Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).

Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.

Kim, Y.S. et al., "Direct Copper Electroless Deposition on a Tungsten Barrier Layer for Ultralarge Scale Integration," J. Electrochem. Soc., vol. 152, Issue 2, pp. C89-C95, (2005).

Au, Y. et al., "Filling Narrow Trenches by Iodine-Catalyzed CVD of Copper and Manganese on Managanese Nitride Barrier/Adhesion Layers," J. Electrochem. Soc., vol. 158, Issue 5, pp. D248-D253, (2011).

Williams, K.R. et al., "Etch Rates for Micromachining Processing," J. Microelectromechanical Systems, vol. 5, No. 4, pp. 256-269, (1996).

Williams, K.R. et al., "Etch Rates for Micromachining Processing," Part II, J. Microelectromechanical Systems, vol. 12, No. 6, pp. 761-778, (2003).

Claes, M. et al., "Selective Wet Etching of Hf-Based Layers," Abs. 549, 204th Meeting, The Electrochemical Society, Inc., 1 page, (2003).

Non Final Office Action for Corresponding U.S. Appl. No. 14/468,650, filed Aug. 26, 2014, 19 pages, dated Feb. 5, 2016.

Invitation to Pay Additional Fees and Partial International Search Report for PCT/US2015/046035, dated Jan. 22, 2016, 9 pages.

Kang, D. et al., "Improving the Cell Characteristics Using Low-k Gate Spacer in 1Gb NAND Flash Memory," Electron Devices Meeting, IEDM '06 International, IEEE, pp. 1-4, (2006).

Bidaud, M. et al., "High Reliable In Situ Steam Generation Process for 1.5-2.5nm Gate Oxides," 197th ECS Conf. vol. 2000-1, Abs. No. 540 (May 2000).

U.S. Appl. No. 14/133,979, filed Dec. 19, 2013, SanDisk Technologies Inc.

U.S. Appl. No. 14/183,152, filed Feb. 18, 2014, SanDisk Technologies Inc.

(56) References Cited

OTHER PUBLICATIONS

U.S. Appl. No. 14/219,161, filed Mar. 19, 2014, SanDisk Technologies Inc.
U.S. Appl. No. 14/225,116, filed Mar. 25, 2014, SanDisk Technologies Inc.
U.S. Appl. No. 14/225,176, filed Mar. 25, 2014, SanDisk Technologies Inc.
U.S. Appl. No. 14/264,262, filed Apr. 29, 2014, SanDisk Technologies Inc.
U.S. Appl. No. 14/264,312, filed Apr. 29, 2014, SanDisk Technologies Inc.
U.S. Appl. No. 14/264,407, filed Apr. 29, 2014, SanDisk Technologies Inc.
U.S. Appl. No. 14/282,567, filed May 20, 2014, SanDisk Technologies Inc.
U.S. Appl. No. 14/319,283, filed Jun. 30, 2004, SanDisk Technologies Inc.
U.S. Appl. No. 14/468,650, filed Aug. 26, 2014, SanDisk Technologies Inc.
U.S. Appl. No. 14/957,762, filed Dec. 3, 2015, SanDisk Technologies Inc.

* cited by examiner

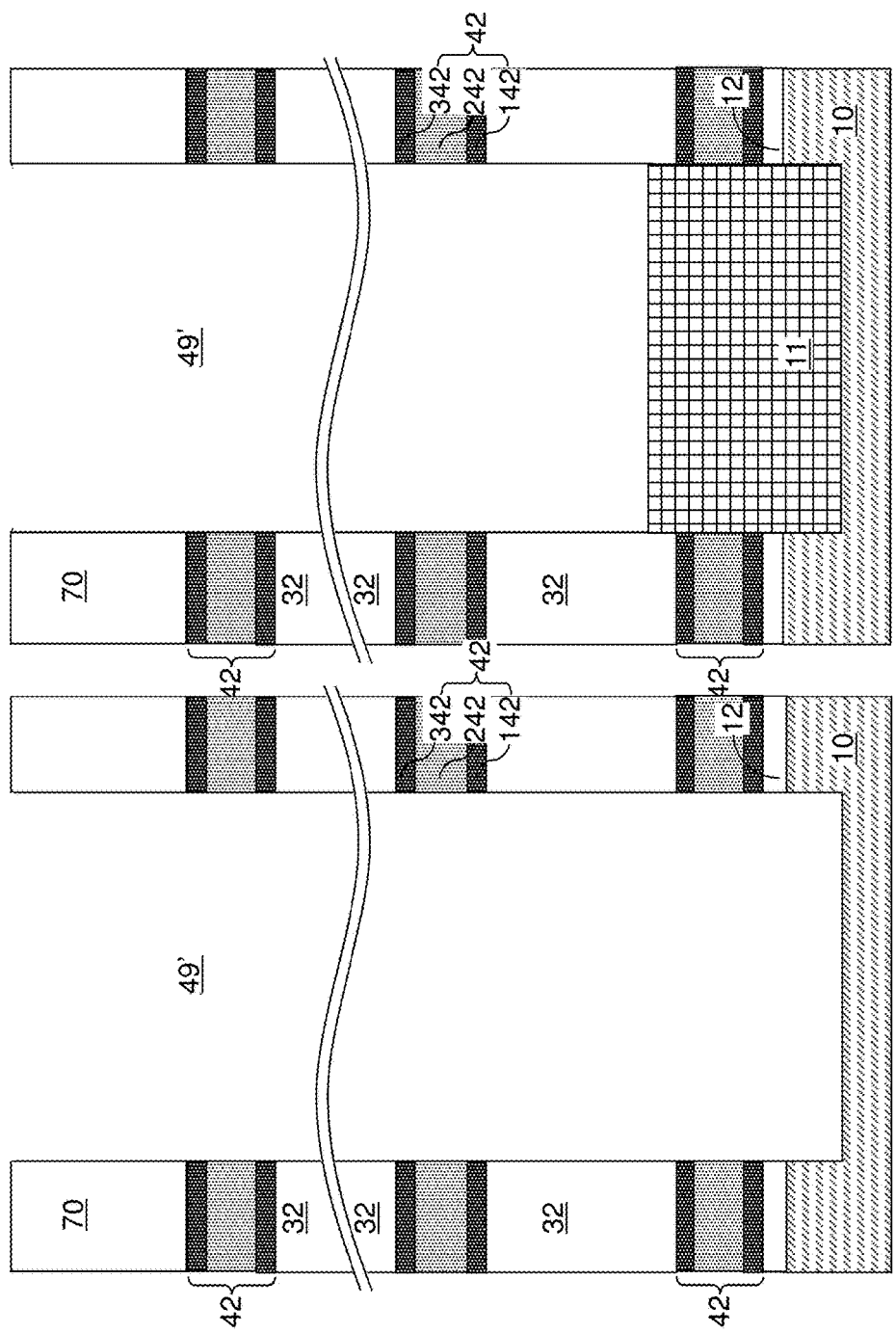

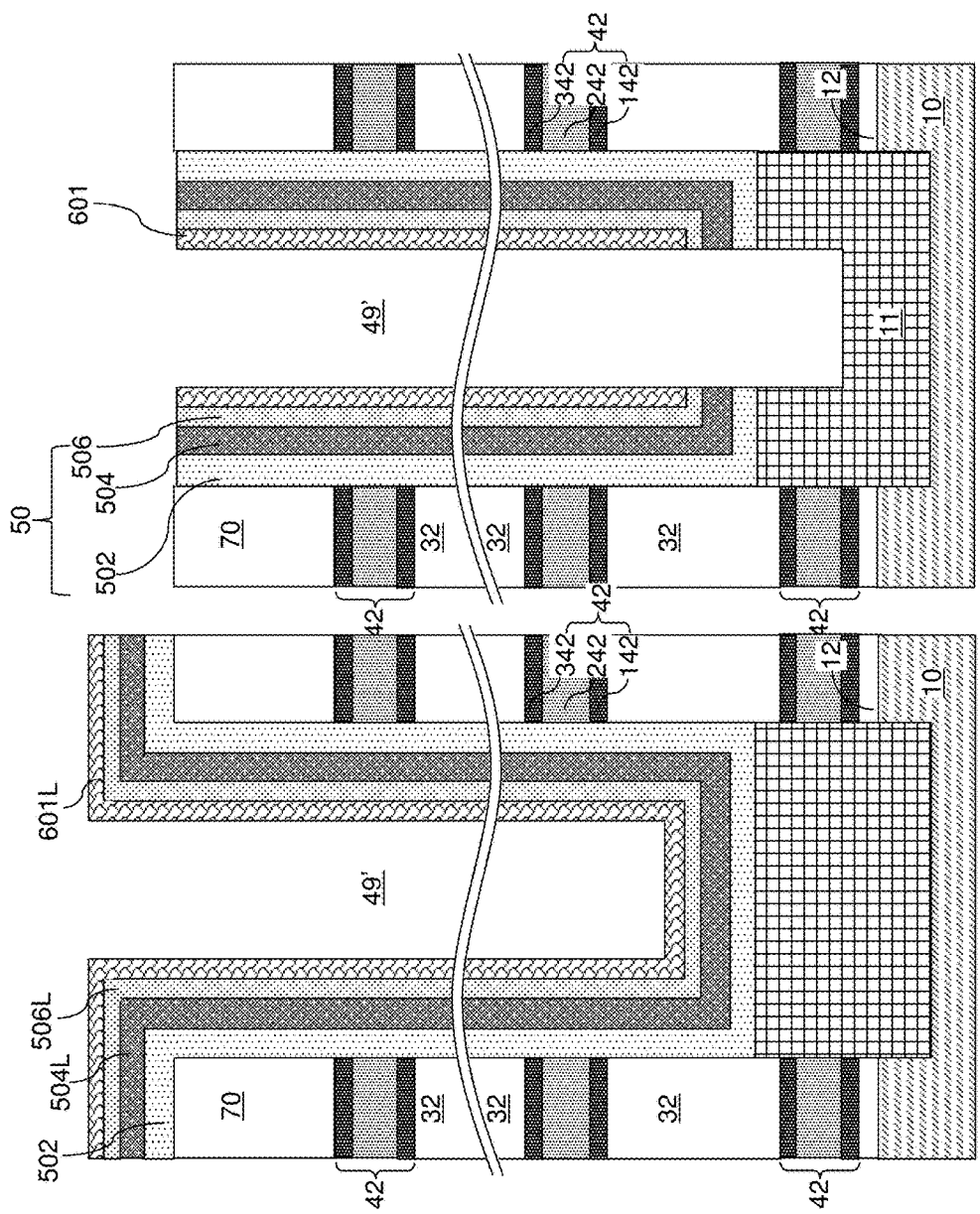

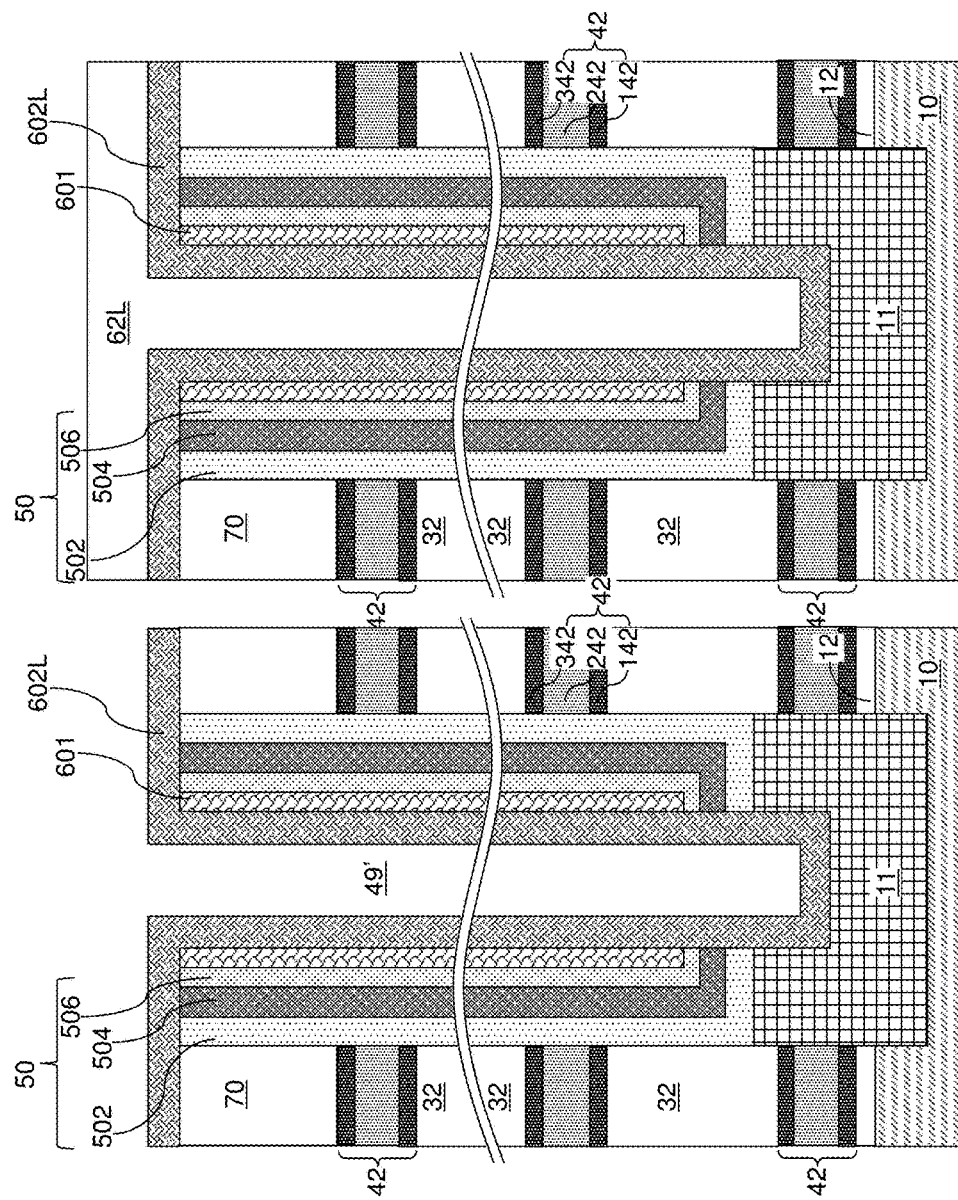

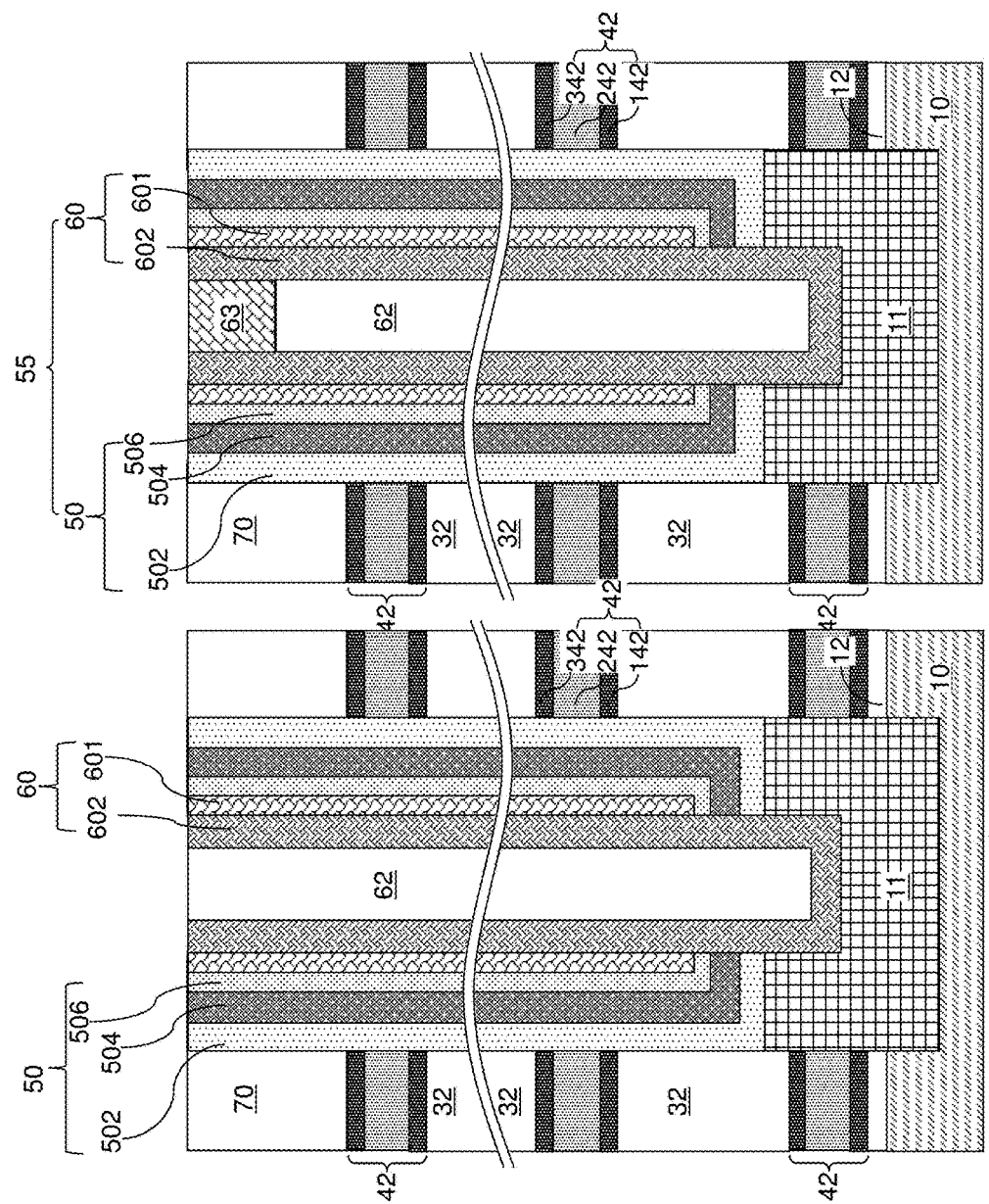

METHOD OF REDUCING CONTROL GATE ELECTRODE CURVATURE IN THREE-DIMENSIONAL MEMORY DEVICES

FIELD

The present disclosure relates generally to the field of semiconductor devices and specifically to three-dimensional memory structures, such as vertical NAND strings and other three-dimensional devices, and methods of making thereof.

BACKGROUND

Three-dimensional vertical NAND strings having one bit per cell are disclosed in an article by T. Endoh, et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a method of manufacturing a memory device is provided. An alternating stack comprising insulating layers and compositionally modulated sacrificial material layers is formed over a substrate. Each of the compositionally modulated sacrificial material layers has a vertical modulation of material composition. A memory opening is formed through the alternating stack. A silicon-containing material liner is formed on a sidewall of the memory opening. The silicon-containing material liner is converted into a silicon-oxide-containing blocking dielectric employing an oxidation process. Each of the compositionally modulated sacrificial material layers provides greater resistance to conversion into a silicon-oxide-containing material at upper and lower portions thereof than at a middle portion thereof. A memory stack structure including the silicon-oxide-containing blocking dielectric is formed in the memory opening.

According to an aspect of the present disclosure, a three-dimensional memory device comprises an alternating stack of electrically conductive control gate electrode layers and insulating layers located over a substrate, outer blocking dielectrics located adjacent to the respective electrically conductive control gate electrode layers, and an array of memory stack structures. Each memory stack structure extends through the alternating stack and includes a memory film and a semiconductor channel laterally surrounded by the memory film. The memory film comprises a tunneling dielectric surrounding the semiconductor channel, a charge storage dielectric layer surrounding the tunneling dielectric, and an inner silicon-oxide-containing blocking dielectric surrounding the charge storage dielectric layer. The inner silicon-oxide-containing blocking dielectric comprises laterally protruding portions having bird's beak shape that contact a respective horizontal surface of the insulating layers, a protrusion that extends into a middle of each outer blocking dielectric, first recesses located between the protrusion and the laterally protruding portions, and second recesses located between the laterally protruding portions in adjacent device levels and adjacent to the respective insulating layers.

According to another aspect of the present disclosure, a three-dimensional memory device comprises an alternating stack of first layers and insulating layers located over a substrate; and an array of memory stack structures, each memory stack structure extending through the alternating stack and including a memory film and a semiconductor channel laterally surrounded by the memory film. The first layers comprise electrically conductive layers in a device region of the device and a stack of silicon nitride layers having different atomic ratios of nitrogen atoms to silicon atoms in at least one other region of the device.

BRIEF DESCRIPTION OF THE DRAWINGS

FIGS. 3A-3D are sequential vertical cross-sectional views of a memory opening within the exemplary structure during various processing steps employed to form a silicon-oxide-containing blocking dielectric according to an embodiment of the present disclosure.

FIGS. 5A-5F are sequential vertical cross-sectional view of the memory opening of FIG. 3D during subsequent processing steps employed to form a memory stack structure according to an embodiment of the present disclosure.

DETAILED DESCRIPTION

Figure 1:
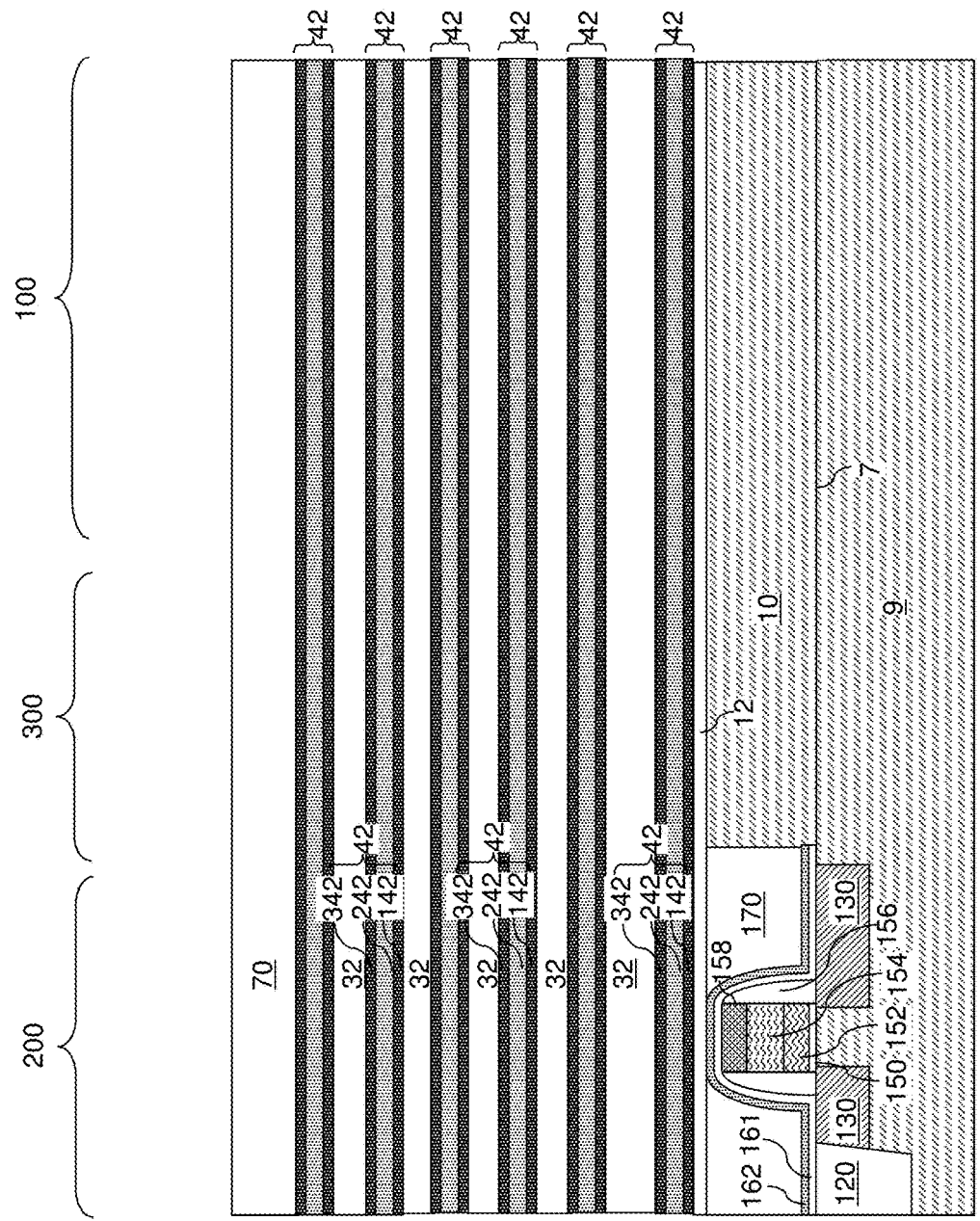
FIG. 1 is a vertical cross-sectional view of an exemplary structure after formation of an alternating stack of insulating layers and compositionally modulated sacrificial material layers according to an embodiment of the present disclosure.

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. Disclosure of an embodiment in which a first element comprises a second element herein also discloses another embodiment in which the first element consists essentially of, or consists of, the second element except for cases in which presence of an additional element is inherently implied.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor. A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which may include a semiconductor substrate (e.g., a single crystalline silicon wafer). The substrate can include a substrate semiconductor layer 9 including a top surface 7, which is herein referred to as a major surface of the substrate (as opposed to a minor surface having a lesser area such as a sidewall surface of the substrate semiconductor layer 9). The semiconductor well layer 10 is a semiconductor material layer, and can include at least one elemental semiconductor material (e.g., silicon, such as single crystalline silicon), at least one III-V compound semiconductor material, at least one II-VI compound semiconductor material, at least one organic semiconductor material, or other semiconductor materials known in the art.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. All measurements for electrical conductivities are made at the standard condition. The semiconductor well layer 10 can include at least one doped well (not expressly shown) having a substantially uniform dopant concentration therein.

The exemplary structure can have multiple regions for building different types of devices. Such areas can include, for example, a device region 100, a contact region 300, and a peripheral device region 200. At least one semiconductor device for a peripheral circuitry can be formed on a portion of the substrate semiconductor layer 9. The at least one semiconductor device can include, for example, field effect transistors that are formed in the peripheral device region 200. Optionally, a portion of the substrate semiconductor layer 9 in the peripheral device region may be recessed by a masked recess etch, or may be raised by a selective epitaxy process that employs a dielectric hard mask that covers other regions, prior to formation of the at least one semiconductor device therein.

Optionally, shallow trench isolation structures 120 may be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer.

Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor well layer 10 can be formed on the top surface of the substrate semiconductor layer 9 by deposition of a single crystalline semiconductor material, for example, by selective epitaxy. Alternatively, the optional semiconductor well layer 10 may be formed by implantation of electrical dopants (p-type dopants or n-type dopants) into at least one upper portion of the substrate semiconductor layer 9. In case the optional semiconductor well layer 10 is not formed, the substrate semiconductor layer 9 can extend to the top surface of the substrate. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor well layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor well layer 10 can have a top surface that is coplanar with the top surface of the planarization dielectric layer 170.

In one embodiment, the semiconductor well layer 10 can include at least one a doped well in the device region 100. As used herein, a "doped well" refers to a portion of a semiconductor material having a doping of a same conductivity type (which can be p-type or n-type) and a substantially same level of dopant concentration throughout. The doped well can be the same as the semiconductor well layer 10 or can be a portion of the semiconductor well layer 10. The conductivity type of the doped well is herein referred to as a first conductivity type, which can be p-type or n-type. The dopant concentration level of the doped well is herein referred to as a first dopant concentration level. In one embodiment, the first dopant concentration level can be in a range from $1.0 \times 10^{15}/cm^3$ to $1.0 \times 10^{18}/cm^3$, although lesser and greater dopant concentration levels can also be employed. As used herein, a dopant concentration level refers to average dopant concentration for a given region.

Optionally, a gate dielectric layer 12 can be formed above the semiconductor well layer 10. The gate dielectric layer 12 can be employed as the gate dielectric for a first source select gate electrode. The gate dielectric layer 12 can include, for example, silicon oxide and/or a dielectric metal oxide (such as $HfO_2$, $ZrO_2$, $LaO_2$, etc.). The thickness of the gate dielectric layer 12 can be in a range from 3 nm to 30 nm, although lesser and greater thicknesses can also be employed.

An alternating stack of insulating layers 32 and compositionally modulated sacrificial material layers 42 is formed over the top surface of the substrate, which can be, for example, on the top surface of the gate dielectric layer 12. As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating stack of insulating layers 32 and compositionally modulated sacrificial material layers 42 may begin with an instance of the insulating layers 32 or with an instance of the compositionally modulated sacrificial material layers 42, and may end with an instance of the insulating layers 31 or with an instance of the compositionally modulated sacrificial material layers 42. In one embodiment, an instance of an insulating layer 32 and an instance of a compositionally modulated sacrificial material layer 42 may form a unit that is repeated with periodicity within the alternating plurality.

The alternating stack of insulating layers 32 and compositionally modulated sacrificial material layers 42 constitutes an in-process alternating stack that is subsequently modified. As used herein, a "prototype" structure or an "in-process" structure refers to a transient structure that is subsequently modified in the shape or composition of at least one component therein.

The insulating layers 32 include a first material, and the compositionally modulated sacrificial material layers 42 include a set of second materials. Each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. Each insulating layer 32 can have a thickness in a range from 10 nm to 100 nm, although lesser and greater thicknesses can also be employed.

The set of second materials of the compositionally modulated sacrificial material layers 42 includes sacrificial materials that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

As used herein, "compositional modulation" refers to modulation in material composition, i.e., modulation in the atomic percentages of constituent atoms. According to an aspect of the present disclosure, each of the compositionally modulated sacrificial material layers 42 has a vertical modulation of material composition therein (i.e., material composition modulation in the direction perpendicular to the top surface 7 of the substrate (9, 10)). In one embodiment, each of the compositionally modulated sacrificial material layers 42 can include a layer stack of silicon-containing materials that may be converted into a silicon-oxide-containing material. As used herein, a "silicon-oxide-containing material" refers to silicon oxide or silicon oxynitride. A silicon-oxide-containing material can be stoichiometric or non-stoichiometric. As used herein, silicon oxide refers to a dielectric compound consisting essentially of silicon and oxygen. As used herein, silicon oxynitride refers to a dielectric compound comprising silicon, oxygen, and nitrogen as its majority constituents.

In one embodiment, each of the compositionally modulated sacrificial material layers 42 provides greater resistance to conversion into a silicon-oxide-containing material at upper and lower portions thereof than at a middle portion thereof. The conversion process may be a thermal oxidation process or a plasma oxidation process, such as an in-situ steam generation ("ISSG") oxidation process. In one embodiment, ISSG oxidation is a low-pressure process which may be performed in a cold-walled rapid thermal processing reactor chamber. In the ISSG process, $H_2$ and $O_2$ gases may be provided directly into the chamber without pre-combustion. The hot substrate may cause these gases react in situ to provide primary species including hydroxyl groups (—OH) and atomic oxygen (O*) which causes oxidation of one or more layers located on or over the substrate. In one embodiment, each of the compositionally modulated sacrificial material layers 42 comprises a layer stack (142, 242, 342) of silicon nitride layers having different atomic ratios between nitrogen atoms and silicon atoms. The top and bottom layers 142 and 342 have a higher silicon to nitrogen ratio than the middle layer 242. For example, each of the compositionally modulated sacrificial material layers 42 can comprise a layer stack including, from bottom to top, a lower silicon-rich silicon nitride layer 142, a base-stoichiometry silicon nitride layer 242, and an upper silicon-rich silicon nitride layer 342. As used herein, a "base-stoichiometry silicon nitride layer" refers to a silicon nitride layer having a base stoichiometry, i.e., a stoichiometry that forms the basis of comparison for other silicon nitride layers. Each of the upper silicon-rich silicon nitride layer 342 and the lower silicon-rich silicon nitride layer 142 has a greater silicon to nitrogen atomic ratio than the middle base-stoichiometry silicon nitride layer 242 (i.e., which corresponds to a lower nitrogen to silicon atomic ration than the middle base-stoichiometry silicon nitride layer 242).

In one embodiment, the base-stoichiometry silicon nitride layer 242 can be a substantially stoichiometric silicon nitride layer. As used herein, a "substantially stoichiometric silicon nitride layer" refers to a silicon nitride layer having a substantially stoichiometric composition. As used herein, a "substantially stoichiometric composition" for silicon nitride includes nitrogen to silicon ratio from 0.99 times 4/3 to 1.01 times 4/3, i.e., from about 1.32 to about 1.34 (and including the nitrogen to silicon ratio of 4 to 3). Alternatively, the base-stoichiometry silicon nitride layer 242 can be a nitrogen rich silicon nitride layer which can have a greater nitrogen to silicon atomic ratio than a substantially stoichiometric silicon nitride layer, i.e., a nitrogen to silicon atomic ratio of greater than 1.34, such as 1.35 to 2. Each of the lower and upper silicon-rich silicon nitride layers (142, 342) has an atomic ratio of nitrogen atoms to silicon atoms that is less than the atomic ratio of nitrogen atoms to silicon atoms for the base-stoichiometry silicon nitride layer 242. For example, if the base-stoichiometery silicon nitride layer 242 is a nitrogen rich silicon nitride layer, then layers 142 and 342 may be stoichiometric or silicon-rich silicon nitride layers. If the base-stoichiometery silicon nitride layer 242 is a stoichiometric silicon nitride layer, then layers 142 and 342 may be silicon-rich silicon nitride layers, where each of the lower and upper silicon-rich silicon nitride layers (142, 342) can have an atomic ratio of nitrogen atoms to silicon atoms that is in a range from 2/3 (i.e., 0.66) to 1.3. In one embodiment, the atomic ratio of nitrogen atoms to silicon atoms may be in a range from 0.90 to 1.25 (such as from 1.0 to 1.20) for each of the lower and upper silicon-rich silicon nitride layers (142, 342).

Each compositionally modulated sacrificial material layers 42 can have a thickness in a range from 10 nm to 100 nm, although lesser and greater thicknesses can also be employed. Each of the lower and upper silicon-rich silicon nitride layers (142, 342) can have a thickness that is in a range from 5% to 40% of a total thickness of layer 42, which includes the lower silicon-rich silicon nitride layer 142, the base-stoichiometry silicon nitride layer 242, and the upper silicon-rich silicon nitride layer 342 (i.e., the thickness of the compositionally modulated sacrificial material layer 42 that includes the respective lower or upper silicon-rich silicon nitride layer (142 or 342)). Thus, each base-stoichiometry silicon nitride layer 242 can have a thickness that is in a range from 20% to 90% of the total thickness of the compositionally modulated sacrificial material layer 42 including the respective base-stoichiometry silicon nitride layer 242.

In one embodiment, each of the compositionally modulated sacrificial material layers 42 may be formed by a plasma assisted chemical vapor deposition (PECVD) process including multiple deposition steps. The PECVD process can be performed in a single process chamber employing different process conditions for the component layers (142, 242, 342) within each compositionally modulated sacrificial material layer 42. The ratio of a silicon precursor gas and a nitrogen-containing gas can be modulated during each deposition step in the plasma assisted chemical vapor deposition process.

In one embodiment, the compositionally modulated sacrificial material layers 42 can comprise compositionally modulated silicon nitride layers. In an illustrate example, the silicon precursor gas may be selected from silane, disilane, dichlorosilane, and trichlorisilane. The nitrogen-containing gas can be ammonia. The ratio of the silicon precursor gas and the nitrogen-containing gas can be increased during deposition of each lower silicon-rich silicon nitride layer 142 and each upper silicon-rich silicon nitride layer, and can be decreased during deposition of each base-stoichiometry silicon nitride layer 242.

The number of repetitions of the pairs of an insulating layer 32 and a compositionally modulated sacrificial material layer (e.g., a control gate electrode or a sacrificial material layer) 42 can be in a range from 2 to 1,024, and typically from 8 to 256, although a greater number of repetitions can also be employed. In one embodiment, each insulating layer 32 in the alternating stack (32, 42) can have a uniform thickness that is substantially invariant within each respective insulating layer 32. In one embodiment, each compositionally modulated sacrificial material layer 42 in the alternating stack (32, 42) can have a uniform thickness that is substantially invariant within each respective compositionally modulated sacrificial material layer 42.

Optionally, an insulating cap layer 70 can be formed over the alternating stack (32, 42). The insulating cap layer 70 includes a dielectric material that is different from the material of the compositionally modulated sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 2:
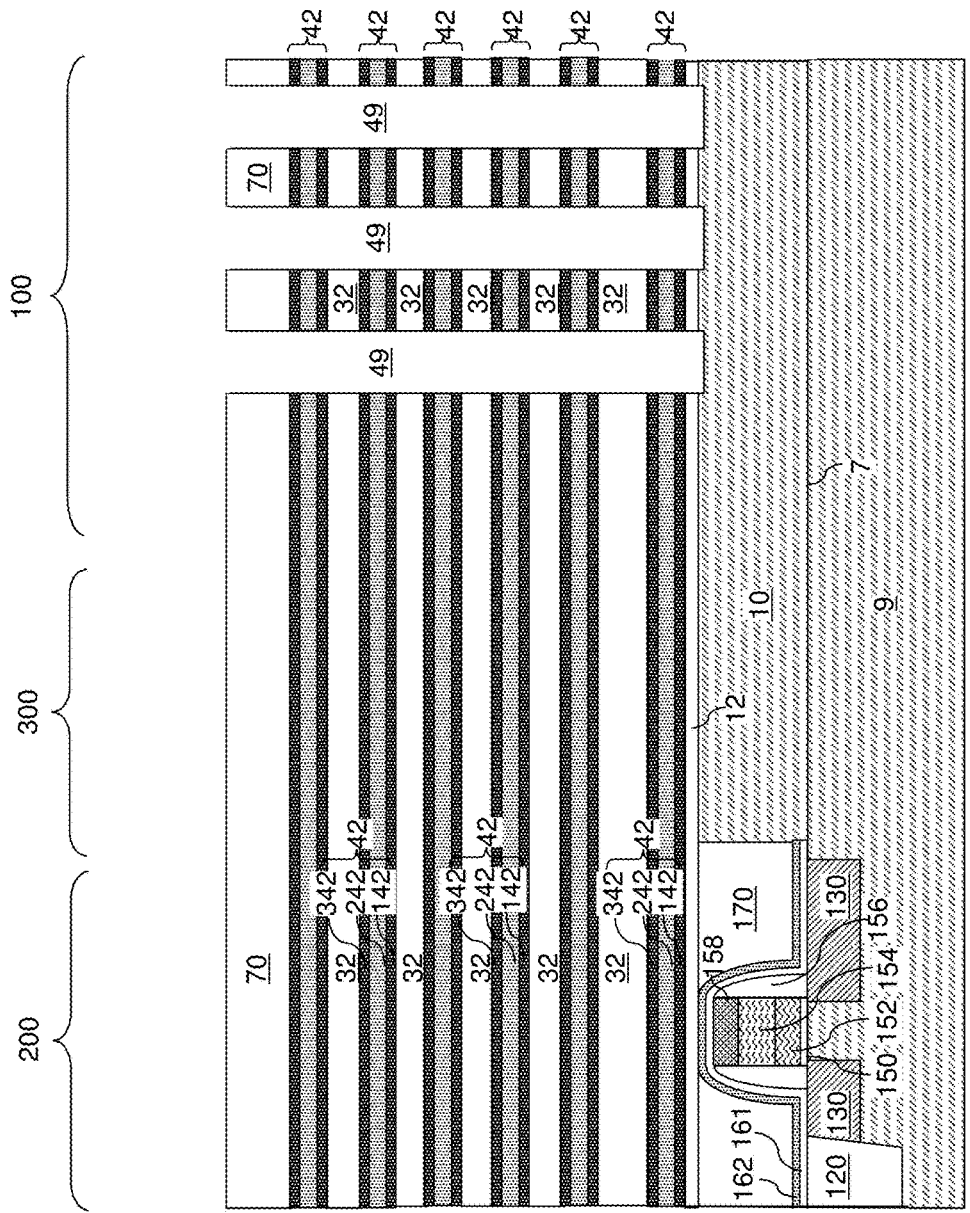
FIG. 2 is a vertical cross-sectional view of an exemplary structure after formation of memory openings extending through the alternating stack according to an embodiment of the present disclosure.

Referring to FIG. 2, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the gate dielectric layer 12 may be used as an etch stop layer between the alternating stack (32, 42) and the substrate. The sidewalls of the memory openings can be substantially vertical, or can be tapered. The patterned lithographic material stack can be subsequently removed, for example, by ashing.

A memory stack structure can be formed in each of the memory opening. FIGS. 3A-3D illustrate sequential vertical cross-sectional views of a memory opening during formation a blocking dielectric in a memory opening. The blocking dielectric can be a silicon-containing-oxide blocking dielectric, i.e., a blocking dielectric that includes a silicon-containing-oxide. As used herein, a "silicon-containing-oxide" element refers to an element that includes a dielectric material selected from silicon oxide and/or silicon oxynitride.

Referring to FIG. 3A, a memory opening 49 is illustrated. The memory opening 49 extends through the insulating cap layer 70, the alternating stack (32, 42), and the gate dielectric layer 12, and optionally into an upper portion of the semiconductor well layer 10. The recess depth of the bottom surface of each memory opening 49 with respect to the top surface of the semiconductor well layer 10 can be in a range from 0 nm to 30 nm, although greater recess depths can also be employed. Optionally, the compositionally modulated sacrificial material layers 42 can be laterally recessed partially to form lateral recesses (not shown), for example, by an isotropic etch.

Referring to FIG. 3B, an epitaxial channel portion 11 can be optionally formed at the bottom of each memory opening 49 by selective epitaxy of a semiconductor material. During the selective epitaxy process, a reactant gas and an etchant gas can be simultaneously or alternatively flowed into a process chamber. Semiconductor surfaces and dielectric surfaces of the exemplary structure provide different nucleation rates for the semiconductor material. By setting the etch rate (determined by the flow of the etchant gas) of the semiconductor material greater than the nucleation rate of the semiconductor material on the dielectric surfaces and less than the nucleation rate of the semiconductor material on the semiconductor surfaces, the semiconductor material can grow from the physically exposed semiconductor surfaces (i.e., from the physically exposed surfaces of the semiconductor well layer 10 at the bottom of each memory opening 49). Each portion of the deposited semiconductor material constitutes an epitaxial channel portion 11, which comprises a single crystalline semiconductor material (e.g., single crystalline silicon) in epitaxial alignment with the single crystalline semiconductor material (e.g., single crystalline silicon) of the semiconductor well layer 10. Each epitaxial channel portion 11 functions as a portion of a channel of a vertical field effect transistor. The top surface of the epitaxial channel portion 11 can be between a pair of sacrificial material layers 42. In other words, a periphery of each epitaxial channel portion 11 can be in physical contact with a sidewall of an insulating layer 32. A cavity 49' is present over an epitaxial channel portion 11 in each memory opening 49.

Optionally, the compositionally modulated sacrificial material layers 42 can be laterally recessed with respect to the sidewalls of the insulating layers 32. In this case, lateral recesses (not shown) can be formed at each level of the compositionally modulated sacrificial material layers 42.

Figures 3C, 3D:
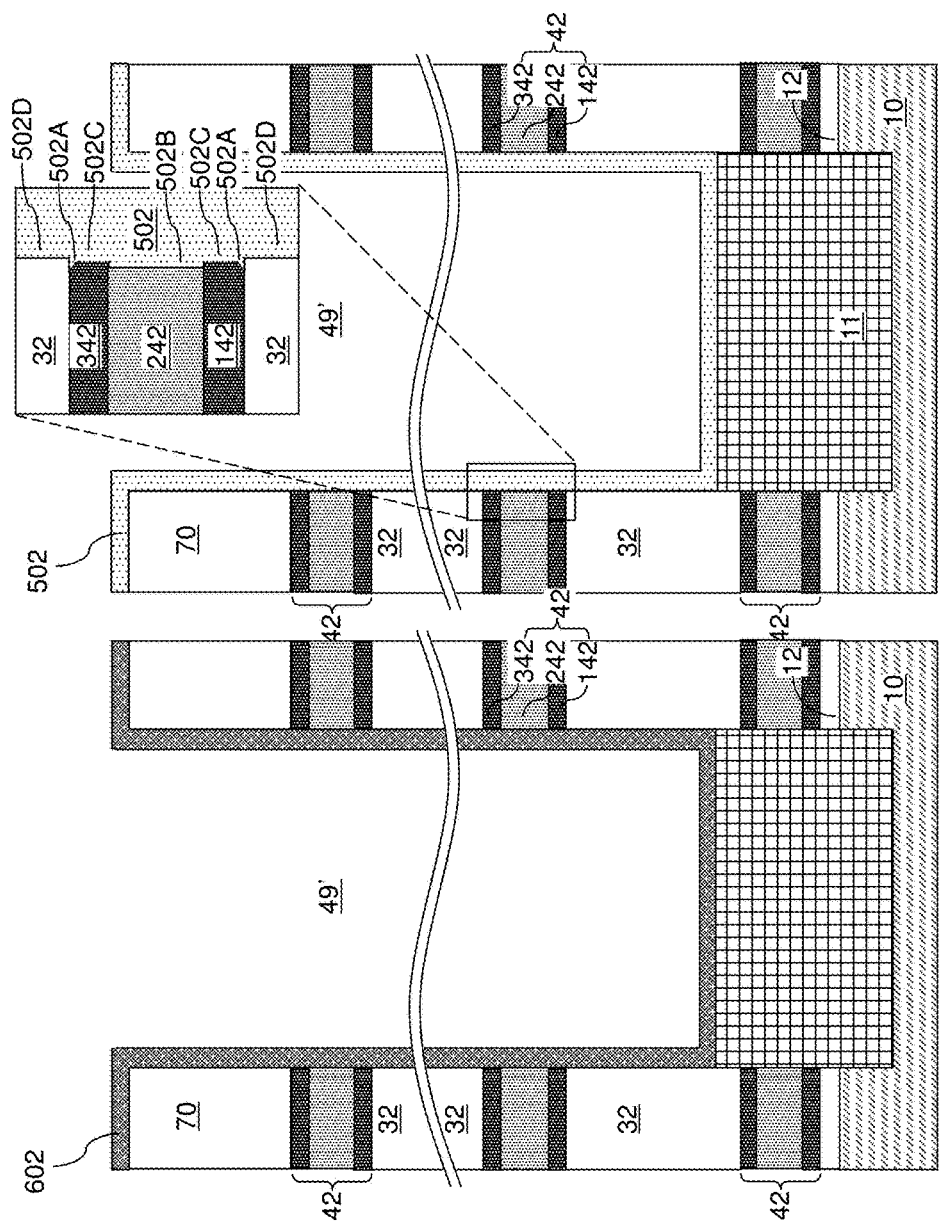

Referring to FIG. 3C, a silicon-containing material liner 602 is deposited on the sidewalls and the bottom surface of the memory opening 49, and over the insulating cap layer 70. As used herein, a "silicon-containing" element is an element that contains silicon atoms at a significant atomic concentration such as greater than 10%, such as 25 to 100%, including 40 to 43% in atomic concentration. For example, the silicon-containing material liner 602 can include stoichiometric or non-stoichiometric silicon nitride, polycrystalline silicon, and/or amorphous silicon. The silicon-containing material liner 602 can be deposited by a conformal deposition method so that the entirety of the silicon-containing material liner 602 has substantially the same thickness, which may be in a range from 1.5 nm to 6 nm, although lesser and greater thicknesses can also be employed.

In one embodiment, the silicon-containing material liner 602 comprises a silicon nitride liner. In one embodiment, the silicon-containing material liner 602 can include stoichiometric silicon nitride. In one embodiment, the silicon nitride liner can be deposited by a conformal deposition process selected from low pressure chemical vapor deposition (LP-CVD) and atomic layer deposition (ALD).

Referring to FIG. 3D, the silicon-containing material liner 602 can be converted into a silicon-oxide-containing blocking dielectric 502 employing an oxidation process. The silicon-oxide-containing blocking dielectric 502 is a blocking dielectric that includes a silicon-oxide-containing material, i.e., a blocking dielectric that includes silicon oxide and/or silicon oxynitride. In one embodiment, the silicon-containing material liner 602 can be converted into the silicon-oxide-containing blocking dielectric 502 by a process selected from a thermal oxidation process and a plasma oxidation process, such as an ISSG oxidation process. In one embodiment, the silicon-oxide-containing blocking dielectric 502 comprises a material selected from a stoichiometric silicon dioxide (e.g., $SiO_2$) and silicon oxynitride (e.g., $SiO_{2-x}N_x$, where $0.05<x<0.5$).

In one embodiment, each of the compositionally modulated sacrificial material layers 42 can provide greater resistance to conversion into a silicon-oxide-containing material at upper and lower portions thereof than at a middle portion thereof. For example, each of the compositionally modulated sacrificial material layers 42 can include a lower silicon-rich silicon nitride layer 142 and an upper silicon-rich silicon-nitride layer 342 that provide greater resistance to conversion into a silicon-oxide-containing material than the base-stoichiometry silicon nitride layer 242.

In one embodiment, the insulating layers 32 comprise silicon oxide, and oxygen atoms can diffuse through the insulating layers 32 into surface portions of the compositionally modulated sacrificial material layers 42 during conversion of the silicon-containing material liner 602 into the silicon-oxide-containing blocking dielectric 502. In this case, interfacial portions of the compositionally modulated sacrificial material layers 42 in physical contact with the insulating layers 32 are converted into portions 502A of a silicon-oxide-containing material having shapes of a bird's beak (i.e., having a curved surface terminating in a sharp point) as illustrated in the inset in FIG. 9. By providing a silicon-rich silicon nitride material at interfaces with the insulating layers 32, the surface portions of the compositionally modulated sacrificial material layers 42 (which can include a silicon-rich silicon nitride material) can minimize the volume of the compositionally modulated sacrificial material layers 42 that is converted into a silicon-oxide-containing material. For example, the high atomic concentration of silicon in the silicon-rich silicon nitride materials of the lower and upper silicon-rich silicon nitride layers (142, 342) effectively retards conversion of the interfacial portions of the lower and upper silicon-rich silicon nitride layers (142, 342) into the silicon-oxide-containing material portions (which may be silicon oxide portions or silicon oxynitride portions).

The silicon-oxide-containing material portions that are derived from the interfacial portions of the compositionally modulated sacrificial material layers 42 are incorporated into the silicon-oxide-containing blocking dielectric 502. Thus, the silicon-oxide-containing blocking dielectric 502 can include laterally protruding portions 502A having shapes of a bird's beak that contact a respective horizontal surface of the insulating layers 32, as shown in the inset in FIG. 9. The laterally protruding portions 502A protrude into the silicon rich silicon nitride layers 142 and 342. In an embodiment, depending on the oxidation process, the silicon-oxide-containing blocking dielectric 502 may also have a protrusion 502B which extends into the middle silicon nitride layer 242, since the stoichiometric middle layer silicon nitride layer 242 has a lower oxidation resistance than the top and bottom silicon-rich silicon nitride layers 142 and 342. This leaves recesses 502C in the silicon-oxide-containing blocking dielectric 502 located between the protrusion 502B and the laterally protruding portions 502A and facing the respective top and bottom silicon-rich silicon nitride layers 142 and 342. Furthermore, additional recesses 502D may be located in the silicon-oxide-containing blocking dielectric 502 between the laterally protruding portions 502A in adjacent device levels and adjacent to (i.e., facing) the vertical sides of the respective insulating layers 32.

Figures 4A, 4B:
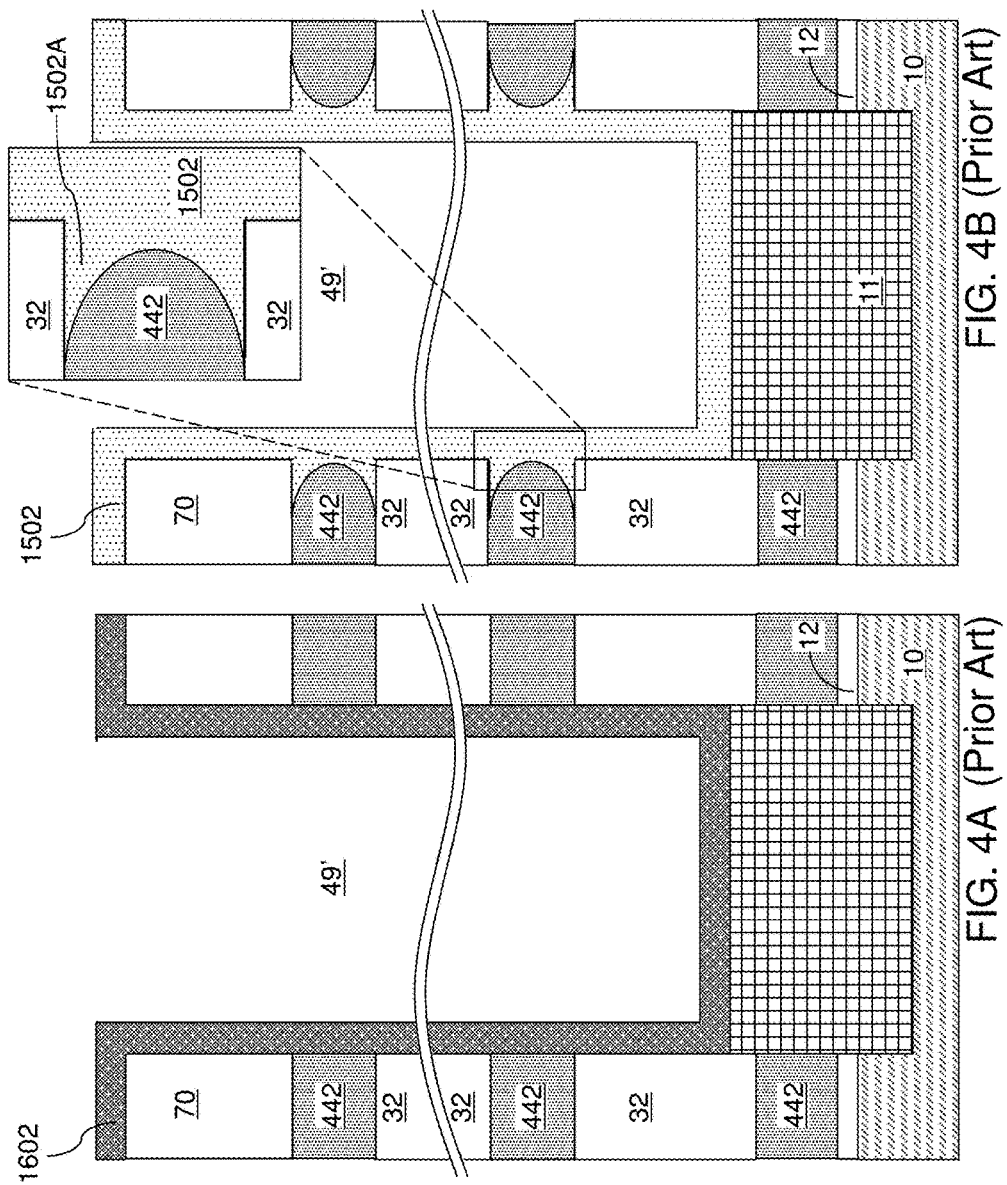
FIGS. 4A and 4B illustrate a processing sequence for forming a blocking dielectric according to a prior art method.

The reduction in the volumes of the silicon-oxide-containing material portions that are derived from the interfacial portions of the compositionally modulated sacrificial material layers 42 with respect to corresponding volumes according to prior art methods is illustrated in FIGS. 4A and 4B. FIG. 4A illustrates a prior art structure including an alternating stack of insulating material layers 32 and homogeneous sacrificial silicon nitride layers 442 having a uniform composition throughout. For example, the homogeneous sacrificial silicon nitride layers 442 can include stoichiometric silicon nitride layers. After formation of memory openings, a silicon nitride liner 1602 can be deposited on the sidewalls of each memory opening. A memory cavity 49' is present in the memory opening.

Referring to FIG. 4B, an oxidation process can be performed to convert the silicon nitride liner 1602 into a silicon-oxide-containing layer 1502. Oxygen atoms can diffuse through the insulating layers 32 and the insulating cap layer 70 to horizontal surface portions of the homogeneous sacrificial silicon nitride layers 442 in proximity to the sidewalls of the memory opening to form bird's beak structures 1502A. The homogeneous sacrificial silicon nitride layers 442 have a homogeneous composition and do not provide additional resistance to oxidation at the interfaces with the insulating layers 32. Thus, the size of each bird's beak structure formed by conversion of corner portions of the silicon nitride liner 1602 into silicon-oxide-containing material portions is sizable. The large bird's beak structures cause significant rounding of the sidewalls of the remaining portions of the silicon nitride liner 1602. Upon replacement of the remaining portions of the silicon nitride liner 1602 with an electrically conductive material, control gate electrodes are formed, which have rounded end portions that contact the silicon-oxide-containing layer. The rounded end portions of such control gate electrodes provide inferior performance relative to control gate electrodes having a relatively flat sidewall.

The embodiments of the present disclosure reduce or prevent rounding of sacrificial material layers after the conversion of a silicon-containing material liner 602 into a silicon-oxide-containing blocking dielectric 502 by providing the sacrificial material layers as compositionally modulated sacrificial material layers 42 that provide enhanced resistance to oxidation at interfaces with the insulating layers.

Referring to FIGS. 5A-5F, processing steps for forming a memory stack structure in each memory opening is provided. Referring to FIG. 5A, a series of layers can be deposited on the structure of FIG. 3D. The series of layers can include a continuous memory material layer 504L, a tunneling dielectric layer 506L, and an optional first semiconductor channel layer 601L can be sequentially deposited in the memory openings 49.

The continuous memory material layer 504L, the tunneling dielectric layer 506L, and the optional first semiconductor channel layer 601L can be sequentially deposited by a series of conformal deposition processes. In one embodiment, the continuous memory material layer 504L can be a charge trapping material including a dielectric charge trapping material, which can be, for example, silicon nitride. Each portion of the continuous memory material layer 504L located at levels of the compositionally modulated sacrificial material layers 42 constitutes charge storage regions. Alternatively, the continuous memory material layer 504L can include a conductive material such as doped polysilicon or a metallic material that is patterned into multiple electrically isolated portions (e.g., floating gates), for example, by being formed within lateral recesses into sacrificial material layers 42. In one embodiment, the continuous memory material layer 504L includes a silicon nitride layer.

The continuous memory material layer 504L can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the continuous memory material layer 504L may comprise an insulating charge trapping material, such as one or more silicon nitride segments. Alternatively, the continuous memory material layer 504L may comprise conductive nanoparticles such as metal nanoparticles, which can be, for example, ruthenium nanoparticles. The continuous memory material layer 504L can be formed, for example, by chemical vapor deposition (CVD), atomic layer deposition (ALD), physical vapor deposition (PVD), or any suitable deposition technique for storing electrical charges therein. The thickness of the continuous memory material layer 504L can be in a range from 2 nm to 20 nm, although lesser and greater thicknesses can also be employed.

The tunneling dielectric layer 506L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 506L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 506L can include a stack of a first silicon oxide layer, a silicon oxynitride layer, and a second silicon oxide layer, which is commonly known as an ONO stack. In one embodiment, the tunneling dielectric layer 506L can include a silicon oxide layer that is substantially free of carbon or a silicon oxynitride layer that is substantially free of carbon. The thickness of the tunneling dielectric layer 506L can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (502, 504L, 506L, 601L).

Referring to FIG. 5B, the optional first semiconductor channel layer 601L, the tunneling dielectric layer 506L, the continuous memory material layer 504L, the silicon-oxide-containing blocking dielectric 502 are sequentially anisotropically etched employing at least one anisotropic etch process. The portions of the first semiconductor channel layer 601L, the tunneling dielectric layer 506L, the continuous memory material layer 504L, and the silicon-oxide-containing blocking dielectric 502 located above the top surface of the insulating cap layer 70 can be removed by the at least one anisotropic etch process. Further, the horizontal portions of the first semiconductor channel layer 601L, the tunneling dielectric layer 506L, the continuous memory material layer 504L, and the silicon-oxide-containing blocking dielectric 502 at a bottom of each cavity 49' can be removed to form openings that extend to a physically exposed surface of the underlying epitaxial channel portion 11. Each of the first semiconductor channel layer 601L, the tunneling dielectric layer 506L, the continuous memory material layer 504L, and the silicon-oxide-containing blocking dielectric 502 can be etched by anisotropic etch process.

Each remaining portion of the first semiconductor channel layer 601L constitutes a first semiconductor channel portion 601. Each remaining portion of the tunneling dielectric layer 506L constitutes a tunneling dielectric 506. Each remaining portion of the continuous memory material layer 504L is herein referred to as a memory material layer 504. The memory material layer 504 can comprise a charge trapping material or a floating gate material. In one embodiment, each memory material layer 504 can include a vertical stack of charge storage regions that store electrical charges upon programming. In one embodiment, the memory material layer 504 can be a charge storage layer in which each portion adjacent to the compositionally modulated sacrificial material layers 42 constitutes a charge storage region.

A surface of the epitaxial channel portion 11 (or a surface of the semiconductor well layer 10 in case the epitaxial channel portions 11 are not employed) can be physically exposed underneath the opening through the first semiconductor channel portion 601, the tunneling dielectric 506, the memory material layer 504, and the silicon-oxide-containing blocking dielectric 502. Optionally, the physically exposed semiconductor surface at the bottom of each cavity 49' can be vertically recessed so that the recessed semiconductor surface underneath the cavity 49' is vertically offset from the topmost surface of the epitaxial channel portion 11 (or of the semiconductor well layer 10 in case epitaxial channel portions 11 are not employed) by a recess distance. A tunneling dielectric 506 is located over the memory material layer 504. A set of silicon-oxide-containing blocking dielectric 502, a memory material layer 504, and a tunneling dielectric 506 in a memory opening 49 constitutes a memory film 50, which includes a plurality of charge storage regions (as embodied as the memory material layer 504) that are insulated from surrounding materials by the silicon-oxide-containing blocking dielectric 502 and the tunneling dielectric 506.

In one embodiment, the first semiconductor channel portion 601, the tunneling dielectric 506, the memory material layer 504, the blocking dielectric 502 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Referring to FIG. 5C, a second semiconductor channel layer 602L can be deposited directly on the semiconductor surface of the epitaxial channel portion 11 or the semiconductor well layer 10 if portion 11 is omitted, and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Referring to FIG. 5D, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5E, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric 506 is surrounded by a memory material layer 504, and laterally surrounds a portion of the semiconductor channel 60. Each adjoining set of a blocking dielectric 502, a memory material layer 504, and a tunneling dielectric 506 collectively constitute a memory film 50, which can store electrical charges with a macroscopic retention time. As used herein, a macroscopic retention time refers to a retention time suitable for operation of a memory device as a permanent memory device such as a retention time in excess of 24 hours.

Referring to FIG. 5F, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each set of a silicon-oxide-containing blocking dielectric 502, charge storage regions (which may be embodied as memory material layer 504), and a tunneling dielectric 506 located within a same memory opening 49 constitutes a memory film 50. Each adjoining pair of a memory film 50 and a semiconductor channel 60 located within a same memory opening 49 constitutes a memory stack structure 55.

Figure 6:
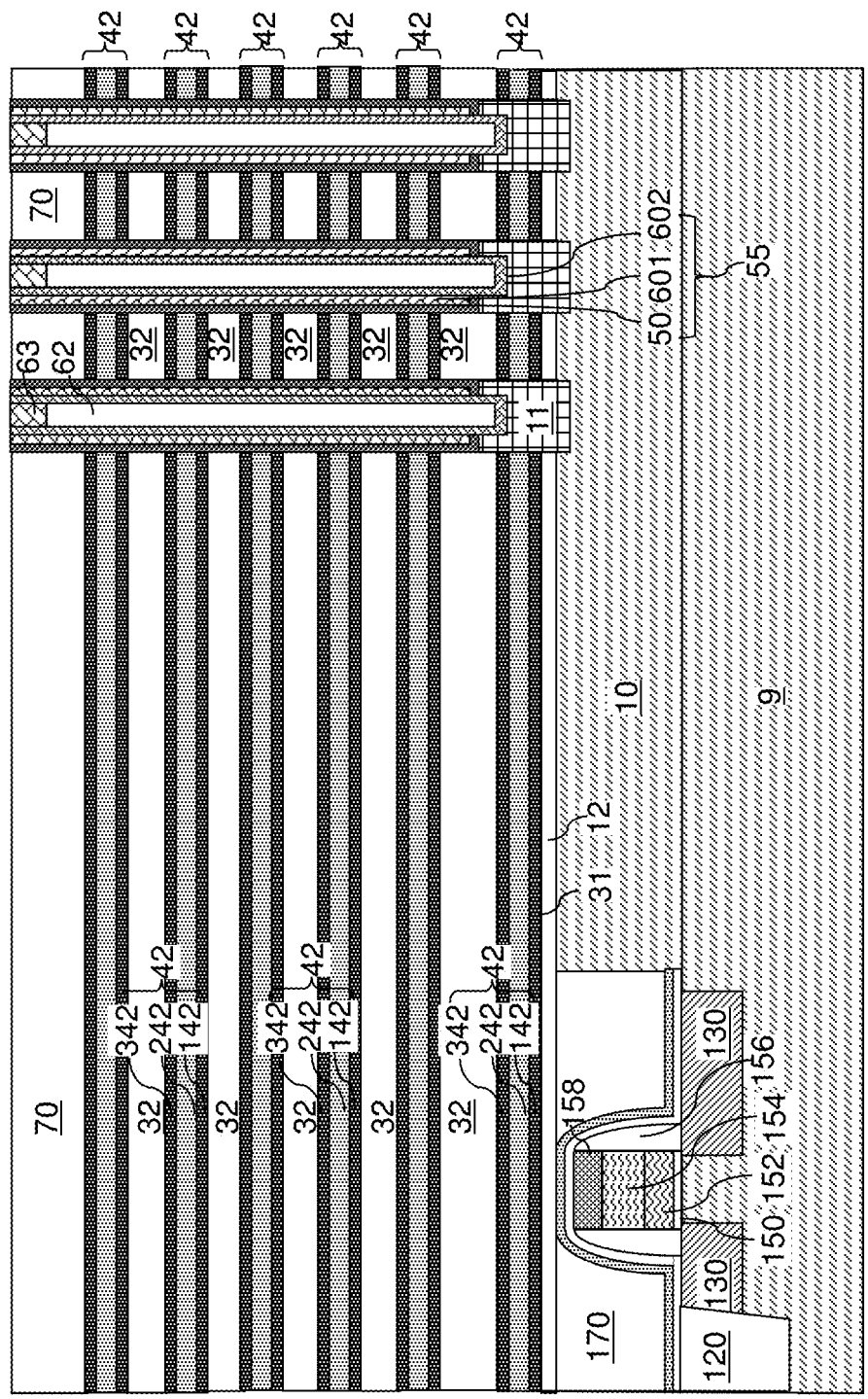
FIG. 6 is a vertical cross-sectional view of the exemplary structure after formation of the memory stack structures according to an embodiment of the present disclosure.

Instances of the exemplary memory stack structure 55 can be embedded into the exemplary structure illustrated in FIG. 2. FIG. 6 illustrates the exemplary structure that incorporates multiple instances of the exemplary memory stack structure 55 of FIG. 5F. Each exemplary memory stack structure 55 includes a semiconductor channel 60 (comprising layers 601, 602); a tunneling dielectric layer 506 laterally surrounding the semiconductor channel 60; a vertical stack of charge storage regions laterally surrounding the tunneling dielectric layer 506 (as embodied as a memory material layer 504); and a blocking dielectric 502. The exemplary structure includes an alternating plurality of material layers (e.g., the compositionally modulated sacrificial material layers 42) and insulating layers 32 located over a semiconductor substrate (e.g., over the semiconductor well layer 10), and a memory opening extending through the alternating stack (32, 42). While the present disclosure is described employing the illustrated configuration for the memory stack structure, the methods of the present disclosure can be applied to alternative memory stack structures.

Figure 7:
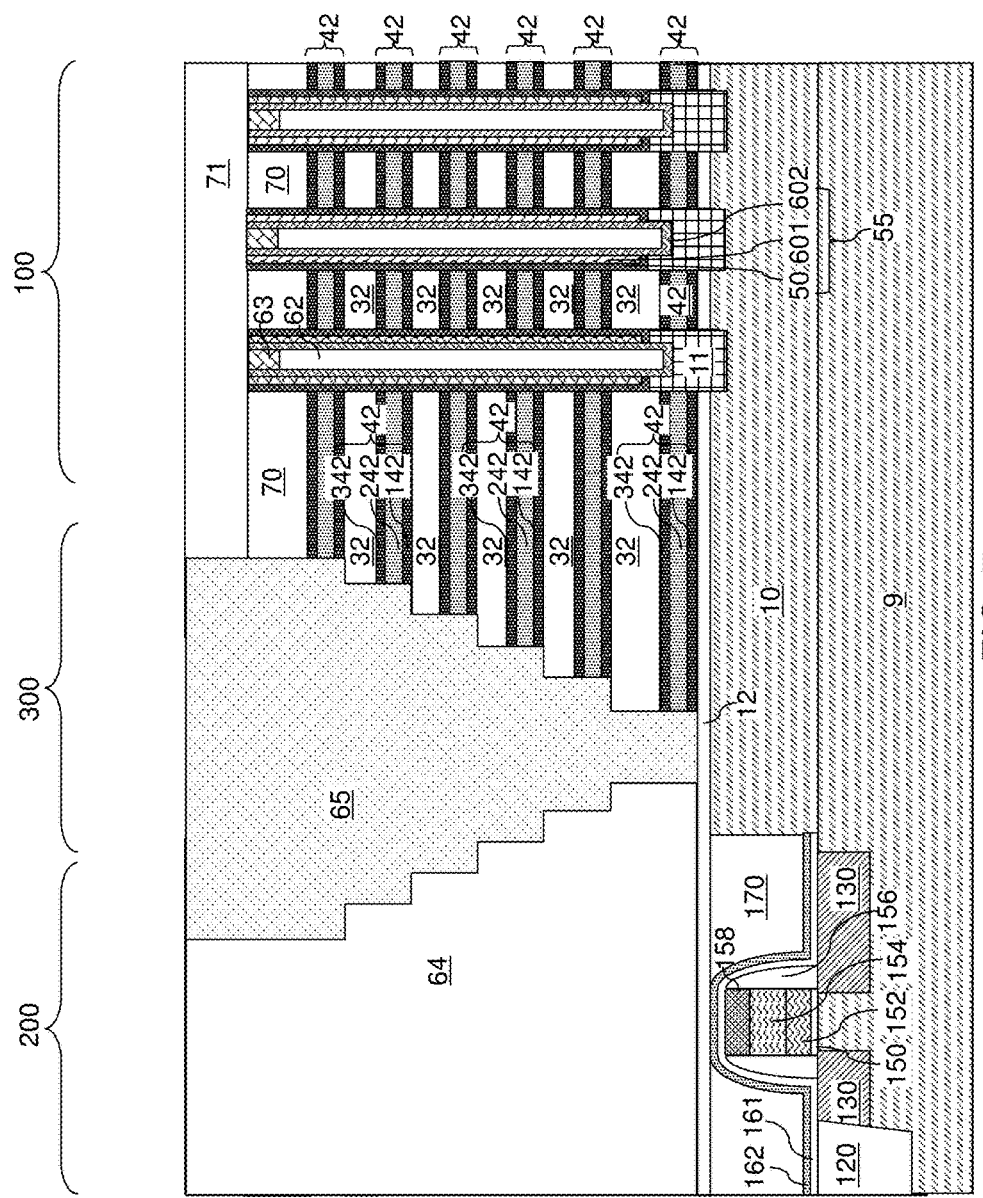
FIG. 7 is a vertical cross-sectional view of the exemplary structure after formation of a set of stepped surfaces and a retro-stepped dielectric material portion according to an embodiment of the present disclosure.

Referring to FIG. 7, an optional first contact level dielectric layer 71 can be formed over the alternating stack (32, 42). As an optional structure, the first contact level dielectric layer 71 may, or may not, be formed. In case the first contact level dielectric layer 71 is formed, the first contact level dielectric layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first contact level dielectric layer 71 can be formed over a horizontal plane including the top surface of the insulating cap layer 70 and the top surfaces of the drain regions 63. The first contact level dielectric layer 71 can be deposited by chemical vapor deposition, atomic layer deposition (ALD), spin-coating, or a combination thereof. The thickness of the first contact level dielectric layer 71 can be in a range from 10 nm to 300 nm, although lesser and greater thicknesses can also be employed.

In one embodiment, the first contact level dielectric layer 71 can be formed as a dielectric material layer having a uniform thickness throughout. The first contact level dielectric layer 71 may be formed as a single dielectric material layer, or can be formed as a stack of a plurality of dielectric material layers. Alternatively, formation of the first contact level dielectric layer 71 may be merged with formation of at least one line level dielectric layer (not shown). While the present disclosure is described employing an embodiment in which the first contact level dielectric layer 71 is a structure separate from an optional second contact level dielectric layer or at least one line level dielectric layer to be subsequently deposited, embodiments in which the first contact level dielectric layer 71 and at least one line level dielectric layer are formed at a same processing step, and/or as a same material layer, are expressly contemplated herein.

In one embodiment, the first contact level dielectric layer 71, the insulating cap layer 70, and the alternating stack (32, 42) can be removed from the peripheral device region 200, for example, by a masked etch process. In addition, a stepped cavity can be formed within the contact region 300 by patterning a portion of the alternating stack (32, 42). As used herein, a "stepped cavity" refers to a cavity having stepped surfaces. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "step" refers to a vertical shift in the height of a set of adjoined surfaces.

The stepped cavity can have various stepped surfaces such that the horizontal cross-sectional shape of the stepped cavity changes in steps as a function of the vertical distance from the top surface of the semiconductor substrate layer 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating stack is defined as the relative position of a pair of a first material layer and a second material layer within the structure. After formation of all stepped surfaces, mask material layers employed to form the stepped surfaces can be removed, for example, by ashing. Multiple photoresist layers and/or multiple etch processes can be employed to form the stepped surfaces.

A dielectric material such as silicon oxide is deposited in the stepped cavity and over the peripheral devices 210 in the peripheral device region 200. Excess portions of the deposited dielectric material can be removed from above the top surface of the first contact level dielectric layer 71, for example, by chemical mechanical planarization (CMP). The remaining portion of the deposited dielectric material filling the stepped cavity in the contact region 300 and overlying the semiconductor substrate layer 10 in the peripheral device region 200 constitutes a retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed as the dielectric material, the silicon oxide of the retro-stepped dielectric material portion 65 may, or may not, be doped with dopants such as B, P, and/or F. The top surface of the retro-stepped dielectric material portion 65 can be coplanar with the top surface of the first contact level dielectric layer 71.

The region over the peripheral devices 210 and the region over the stepped cavities can be filled simultaneously with the same dielectric material, or can be filled in different processing steps with the same dielectric material or with different dielectric materials. The cavity over the peripheral devices 210 can be filled with a dielectric material prior to, simultaneously with, or after, filling of the cavity over the stepped surface of the contact region 300 with a dielectric material. While the present disclosure is described employing an embodiment in which the cavity in the peripheral device region 200 and the stepped cavity in the contact region 300 are filled simultaneously, embodiments are expressly contemplated herein in which the cavity in the peripheral device region 200 and the stepped cavity in the contact region 300 are filled in different processing steps.

Figure 8A:
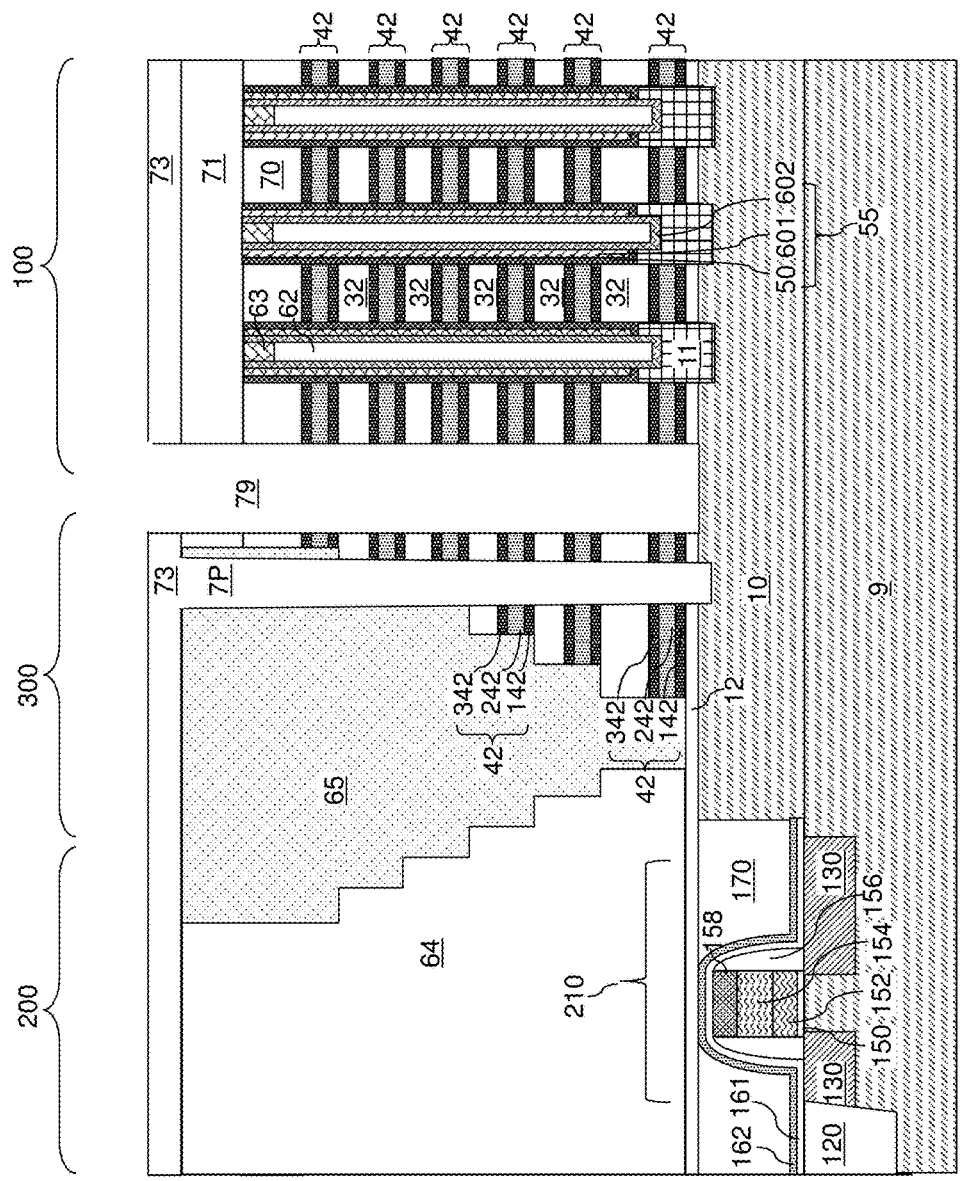
FIG. 8A is a vertical cross-sectional view of the exemplary structure after formation of dielectric pillar structures and formation of backside trenches according to an embodiment of the present disclosure.
Figure 8B:
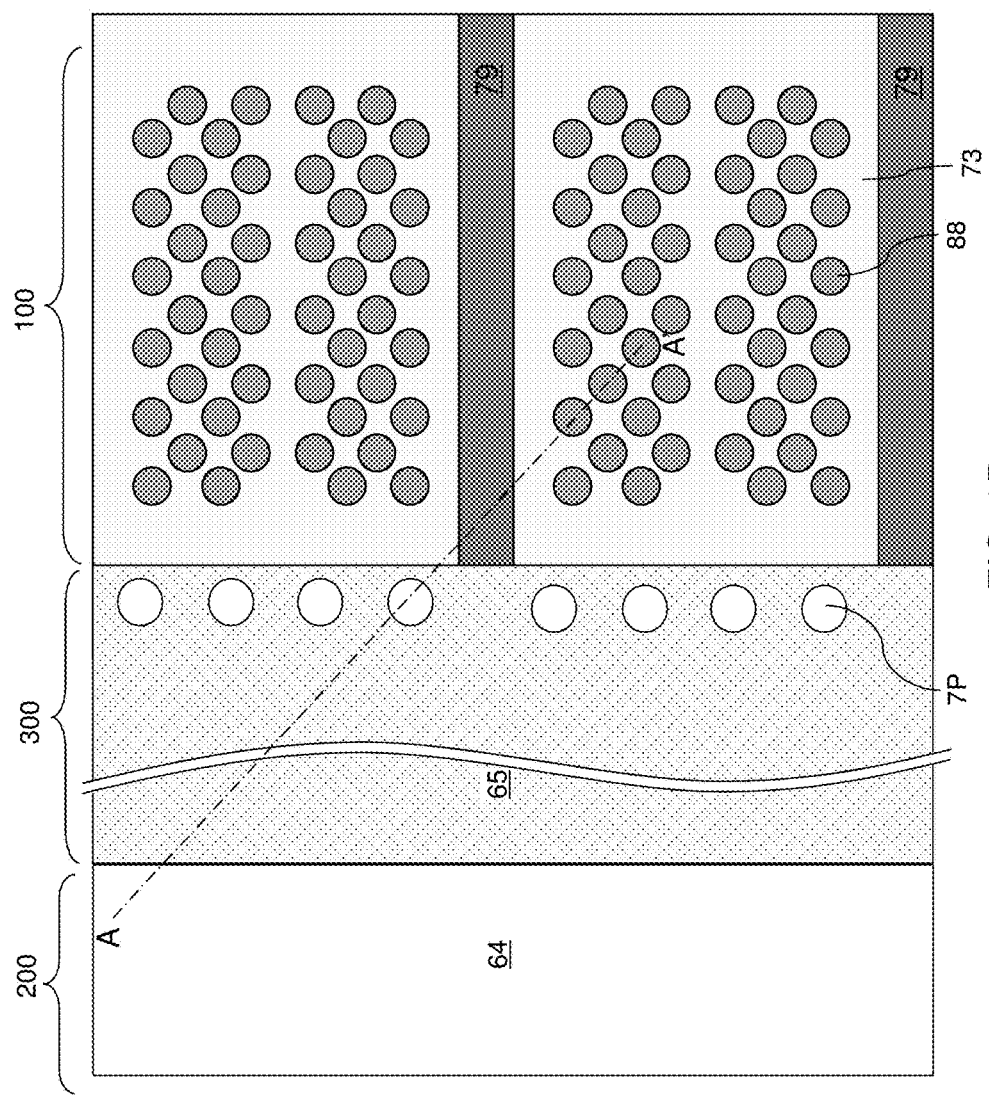
FIG. 8B is a see-through top-down view of the exemplary structure of FIG. 8A. The vertical plane A-A' is the plane of the vertical cross-sectional view of FIG. 8A.

Referring to FIGS. 8A and 8B, dielectric support pillars 7P may be optionally formed through the retro-stepped dielectric material portion 65 and/or through the first contact level dielectric layer 71 and/or through the alternating stack (32, 42). In one embodiment, the dielectric support pillars 7P can be formed in the contact region 300, which is located adjacent to the device region 100. The dielectric support pillars 7P can be formed, for example, by forming an opening extending through the retro-stepped dielectric material portion 65 and/or through the alternating stack (32, 42) and at least to the top surface of the semiconductor substrate layer 10, and by filling the opening with a dielectric material that is resistant to the etch chemistry to be employed to remove the compositionally modulated sacrificial material layers 42.

In one embodiment, the dielectric support pillars 7P can include silicon oxide and/or a dielectric metal oxide such as aluminum oxide. In one embodiment, the portion of the dielectric material that is deposited over the first contact level dielectric layer 71 concurrently with deposition of the dielectric support pillars 7P can be present over the first contact level dielectric layer 71 as a second contact level dielectric layer 73. Each of the dielectric support pillars 7P and the second contact level dielectric layer 73 is an optional structure. As such, the second contact level dielectric layer 73 may, or may not, be present over the insulating cap layer 70 and the retro-stepped dielectric material portion 65. The first contact level dielectric layer 71 and the second contact level dielectric layer 73 are herein collectively referred to as at least one contact level dielectric layer (71, 73). In one embodiment, the at least one contact level dielectric layer (71, 73) can include both the first and second contact level dielectric layers (71, 73), and optionally include any additional via level dielectric layer that can be subsequently formed. In another embodiment, the at least one contact level dielectric layer (71, 73) can include only the first contact level dielectric layer 71 or the second contact level dielectric layer 73, and optionally include any additional via level dielectric layer that can be subsequently formed. Alternatively, formation of the first and second contact level dielectric layers (71, 73) may be omitted, and at least one via level dielectric layer may be subsequently formed, i.e., after formation of a first source contact via structure.

The second contact level dielectric layer 73 and the dielectric support pillars 7P can be formed as a single continuous structure of integral construction, i.e., without any material interface therebetween. In another embodiment, the portion of the dielectric material that is deposited over the first contact level dielectric layer 71 concurrently with deposition of the dielectric support pillars 7P can be removed, for example, by chemical mechanical planarization or a recess etch. In this case, the second contact level dielectric layer 73 is not present, and the top surface of the first contact level dielectric layer 71 can be physically exposed.

Trenches (which are herein referred to as backside trenches 79) can be formed between each neighboring pair of clusters of the memory stack structures 55 by transferring the pattern of the openings in the photoresist layer through the at least one contact level dielectric layer (71, 73), the retro-stepped dielectric material portion 65, and the alternating stack (32, 42). Each backside trench 79 extends through the in-process alternating stack (32, 42) and to the top surface of the substrate (9, 10). A top surface of the semiconductor substrate layer 10 can be physically exposed at the bottom of each backside trench 79. In one embodiment, each backside trench 79 can extend along a first horizontal direction so that clusters of the memory stack structures 55 are laterally spaced along a second horizontal direction that is different from the first horizontal direction. Each cluster of memory stack structures 55 in conjunction with the portions of the alternating stack (32, 42) that surround the cluster constitutes a memory block. Each memory block is laterally spaced from one another by the backside trenches 79.

The alternating stack of insulating layers 32 and the compositionally modulated sacrificial material layers 42 is an in-process structure, i.e., an in-process alternating stack. The in-process alternating stack is subsequently modified by replacement of the compositionally modulated sacrificial material layers 42 with electrically conductive layers.

Figure 9:
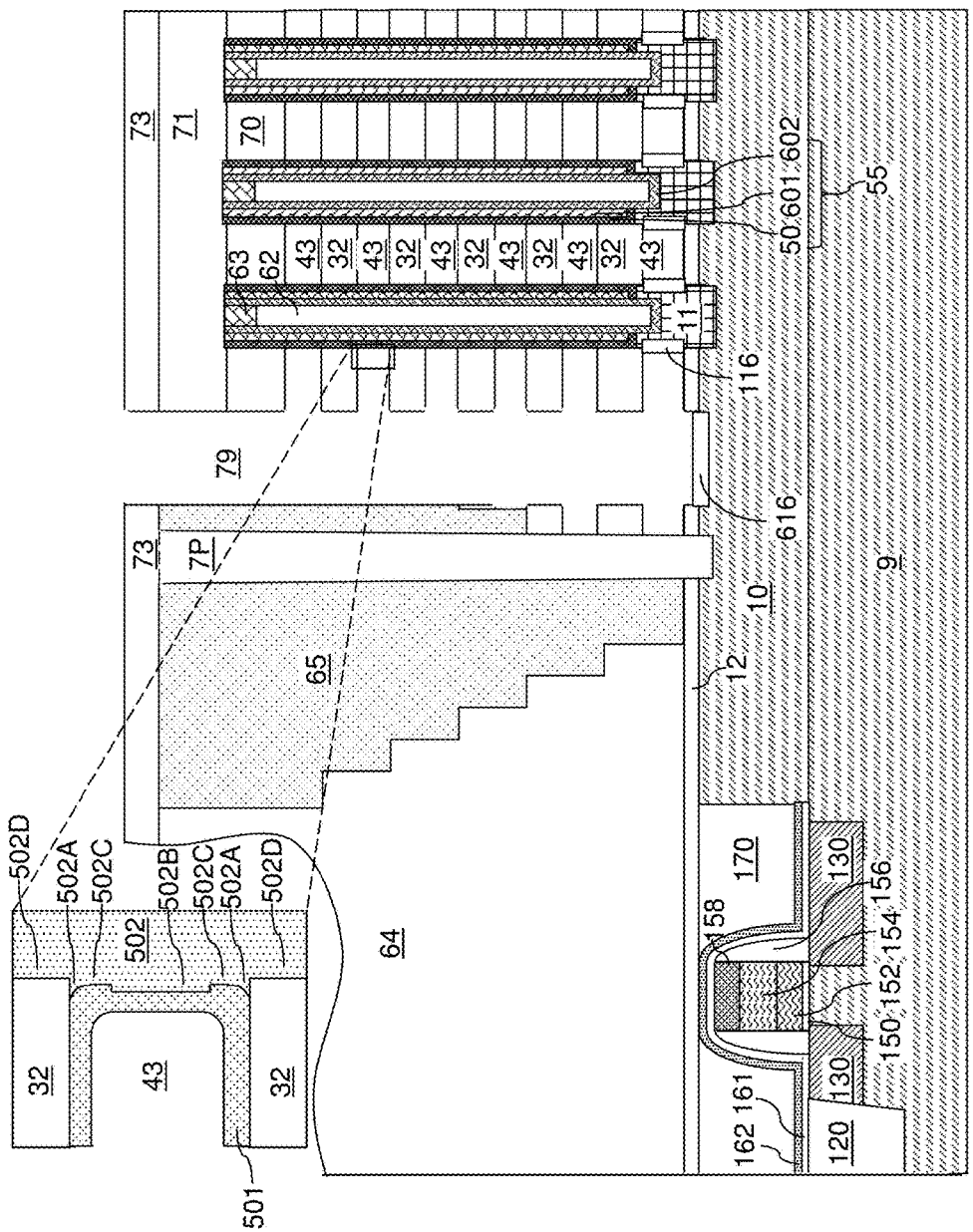
FIG. 9 is a vertical cross-sectional view of the exemplary structure after formation of backside recesses according to an embodiment of the present disclosure.

Referring to FIG. 9, an etchant that selectively etches the second material of the compositionally modulated sacrificial material layers 42 with respect to the first material of the insulating layers 32 can be introduced through the backside trenches 79, for example, employing an etch process. Recesses (which are herein referred to as backside recesses 43) are formed in volumes from which the compositionally modulated sacrificial material layers 42 are removed. The backside trenches 79 and the backside recesses 43 are formed from locations away from the memory stack structures 55, which are formed within memory openings 49 that are also referred to as front side openings. Thus, the backside recesses 79 can be formed by removing remaining portions of the compositionally modulated sacrificial material layers 42 selective to the insulating layers 32 and the memory stack structures 55 employing an etch process that supplies an etchant through the backside trench 79.

The removal of the second material of the compositionally modulated sacrificial material layers 42 can be selective to the first material of the insulating layers 32, the material of the dielectric support pillars 7P, the material of the retro-stepped dielectric material portion 65, the semiconductor material of the semiconductor substrate layer 10, and the material of the outermost layer of the first memory films 50 (i.e., the material of the silicon-oxide-containing blocking dielectrics 502). In one embodiment, each of the compositionally modulated sacrificial material layers 42 can include a layer stack of multiple silicon nitride layers as described above, and the materials of the insulating layers 32, the dielectric support pillars 7P, and the retro-stepped dielectric material portion 65 can be selected from silicon oxide and dielectric metal oxides.

The etch process that removes the second material selective to the first material and the outermost layer of the first memory films 50 can be a wet etch process employing a wet etch solution, or can be a gas phase (dry) etch process in which the etchant is introduced in a vapor phase into the backside trenches 79. For example, if each of the compositionally modulated sacrificial material layers 42 includes a layer stack of various silicon nitride layers, the etch process can be a wet etch process in which the exemplary structure is immersed within a wet etch tank including phosphoric acid, which etches silicon nitride selective to silicon oxide, silicon, and various other materials employed in the art. The dielectric support pillars 7P, the retro-stepped dielectric material portion 65, and the memory stack structures 55 provide structural support while the backside recesses 43 are present within volumes previously occupied by the compositionally modulated sacrificial material layers 42.

The compositional differences among the component layers of the compositionally modulated sacrificial material layers 42 do not significantly affect the profile of the backside recesses 43 because the materials of the various component layers of the compositionally modulated sacrificial material layers 42 can be removed selective to the silicon-oxide-containing blocking dielectrics 502 and the insulating layers 32 at about the same rate. In one embodiment, the insulating layers 32 can include silicon oxide, the silicon-oxide-containing blocking dielectrics 502 can include silicon oxide or a silicon oxynitride including more oxygen atoms than nitrogen atoms, and each of the compositionally modulated sacrificial material layers 42 can include a vertical stack of a lower silicon-rich silicon nitride layer 142, a base-stoichiometry silicon nitride layer 242, and an upper silicon-rich silicon nitride layer 343. In this case, a wet etch employing hot phosphoric acid can be employed to remove the entirety of the compositionally modulated sacrificial material layers 42 with high selectivity to the insulating layers and the silicon-oxide-containing blocking dielectrics 502. Thus, the profile of the outer surface of each silicon-oxide-containing blocking dielectrics 502 as formed at the processing steps of FIG. 3D does not change during formation of the backside recesses 43.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the compositionally modulated sacrificial material layers 42 is removed. The memory openings in which the memory stack structures 55 are formed are herein referred to as front side openings or holes in contrast with the backside recesses 43. In one embodiment, the device region 100 comprises an array of monolithic three-dimensional NAND strings having a plurality of device levels disposed above the substrate (e.g., above the semiconductor substrate layer 10). In this case, each backside recess 43 can define a space for receiving a respective word line of the array of monolithic three-dimensional NAND strings.

Each of the plurality of backside recesses 43 can extend substantially parallel to the top surface of the semiconductor substrate layer 10. A backside recess 43 can be vertically bounded by a top surface of an underlying insulating layer 32 and a bottom surface of an overlying insulating layer 32. In one embodiment, each backside recess 43 can have a uniform height throughout.

Subsequently, physically exposed surface portions of epitaxial channel portions 11 and the doped well layer 10 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116, and to convert each physically exposed surface portion of the semiconductor well layer 10 into a sacrificial dielectric portion 616. In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11. Likewise, each sacrificial dielectric portion 616 includes a dielectric material that includes the same semiconductor element as the semiconductor well layer 10 and additionally includes at least one non-metallic element such as oxygen and/or nitrogen such that the material of the sacrificial dielectric portions 616 is a dielectric material. In one embodiment, the sacrificial dielectric portions 616 can include a dielectric oxide, a dielectric nitride, or a dielectric oxynitride of the semiconductor material of the semiconductor well layer 10.

A backside blocking dielectric layer 501 (see the inset of FIG. 9) can be optionally formed. The backside blocking dielectric layer 501, if present, comprises an additional dielectric material that functions as a control gate dielectric for the control gates to be subsequently formed in the backside recesses 43. In one embodiment, the backside blocking dielectric layer 501 can include a dielectric material that is different from the dielectric material of the silicon-oxide-containing blocking dielectrics 502. In one embodiment, the backside blocking dielectric layer 501 can a dielectric metal oxide, silicon nitride, or a combination thereof. In one embodiment, the backside blocking dielectric layer 501 can include aluminum oxide. The outer blocking dielectric layer 501 can be formed by a conformal deposition method such as low pressure chemical vapor deposition, atomic layer deposition, or a combination thereof. The thickness of the outer blocking dielectric layer 501 can be in a range from 1 nm to 20 nm, although lesser and greater thicknesses can also be employed.

As shown in the inset in FIG. 9, the laterally protruding portions 502A of the silicon-oxide-containing blocking dielectric protrude into the outer blocking dielectric 501 adjacent to the horizontal surfaces of the insulating layers 32. In an embodiment, depending on the oxidation process, the silicon-oxide-containing blocking dielectric 502 may also have a protrusion 502B that extends into the middle of each outer blocking dielectric 501 and recesses 502C between the protrusion 502B and the laterally protruding portions 502A. The outer blocking dielectric 501 has corresponding protrusions which correspond to the recesses 502C and recesses which correspond to the protruding portions 502A, 502B in the silicon-oxide-containing blocking dielectric 502. Furthermore, the additional recesses 502D may be located in the silicon-oxide-containing blocking dielectric 502 between the laterally protruding portions 502A in adjacent device levels and adjacent to (i.e., facing) the vertical sides of respective insulating layers 32. Recesses 502D may be deeper than recesses 502C such that the insulating layers 32 extend closer to the semiconductor channel 60 in the horizontal direction parallel to the top substrate surface 7 than the outer blocking dielectrics 501 located in the backside recesses 43.

The shapes of the backside recesses 43 after formation of the outer blocking dielectric 501, and thus, the shapes of the electrically conductive layers 46 (which function as the control gate electrodes of the memory device) can be affected by the amount of oxidation performed on the compositionally modulated sacrificial material layers 42 and the process conditions (e.g., wet etch process conditions) employed to remove the compositionally modulated sacrificial material layers 42 prior to formation of the outer blocking dielectric 501. Thus, the configuration shown in the inset of FIG. 9 corresponds to one non-limiting embodiment of the present disclosure, and may be omitted. By optimizing the process conditions, control gate electrodes (as embodied as the electrically conductive layers) having substantially vertical sidewall surfaces can be formed.

Figure 10:
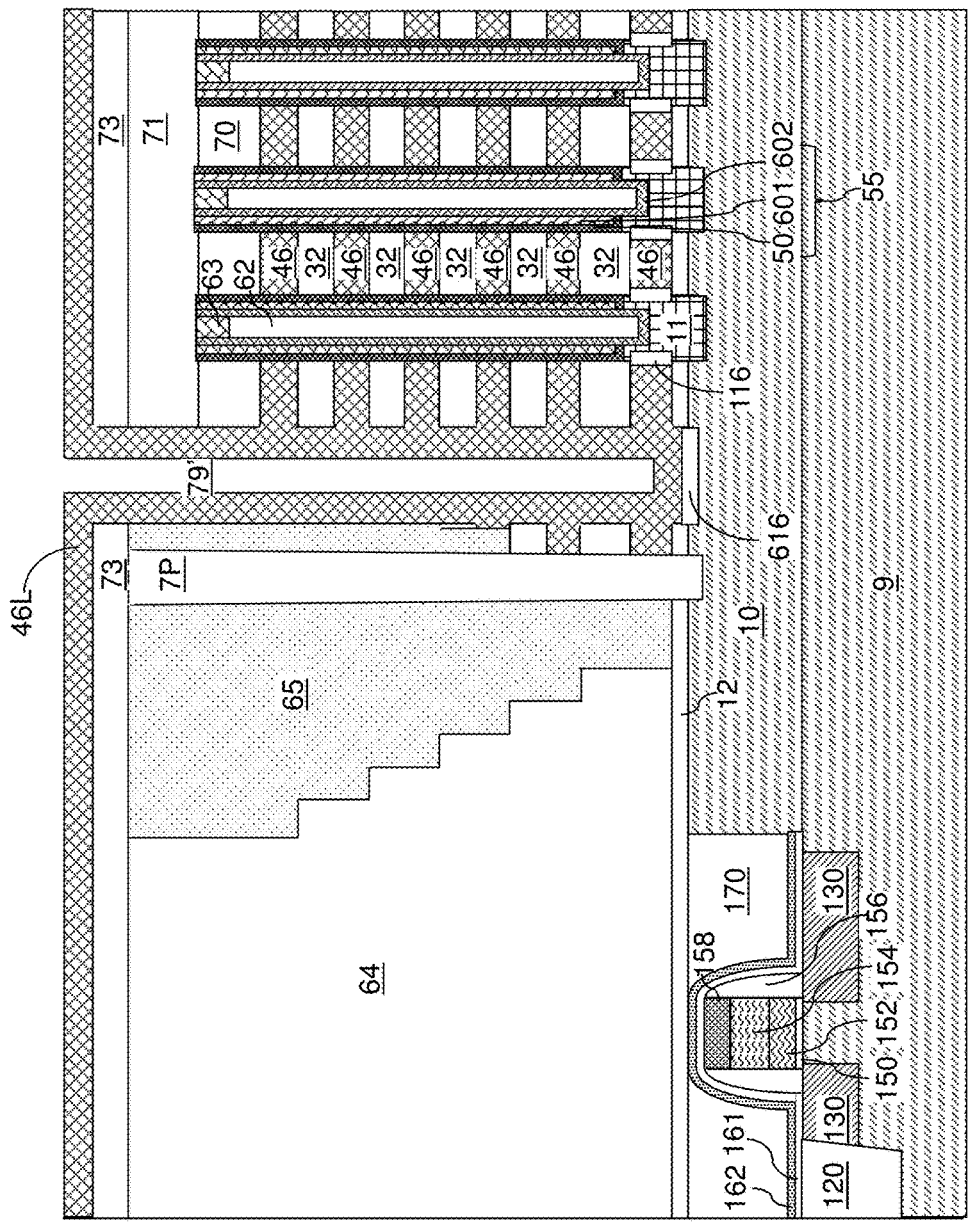
FIG. 10 is a vertical cross-sectional view of the exemplary structure after formation of electrically conductive layers according to an embodiment of the present disclosure.

Referring to FIG. 10, at least one metallic material can be deposited in the plurality of backside recesses 43, on the sidewalls of the at least one the backside contact trench 79, and over the top surface of the second contact level dielectric layer 73. As used herein, a metallic material refers to an electrically conductive material that includes at least one metallic element. The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses 43 can be a combination of titanium nitride layer and a tungsten fill material.

In one embodiment, the metallic material can be deposited by chemical vapor deposition or atomic layer deposition. In one embodiment, the metallic material can be employing at least one fluorine-containing precursor gas as a precursor gas during the deposition process. In one embodiment, the molecule of the at least one fluorine-containing precursor gas cam comprise a compound of at least one tungsten atom and at least one fluorine atom. For example, if the metallic material includes tungsten, $WF_6$ and $H_2$ can be employed during the deposition process. The at least one reactant for depositing the at least one conductive material of the electrically conductive layers 46 can be provided through the backside trench 79 and into the backside recesses 43.

A plurality of electrically conductive layers 46 can be formed in the plurality of backside recesses 43, and a continuous metallic material layer 46L can be formed on the sidewalls of each backside contact trench 79 and over the at least one contact level dielectric layer (71,73). Thus, each compositionally modulated sacrificial material layer 42 can be replaced with an electrically conductive layer 46 in the device region 100 and the contact region 300. The compositionally modulated sacrificial material layers 42 may, or may not, be replaced in other regions (such as the peripheral device region 200) and thus may remain in the final device in one embodiment of the present disclosure. In this embodiment, the final device contains an alternating stack of first layers (42, 46) and insulating layers (32) located over the substrate (9, 10). The first layers (42, 46) comprise electrically conductive layers (46) in the device region 100 of the device and the compositionally modulated silicon nitride layers 42 comprising stack of silicon nitride layers (142, 242, 342) having different atomic ratios of nitrogen atoms to silicon atoms in at least one other region (e.g., in the peripheral region 200) of the device. In another embodiment, the layers 42 may be completely removed from the final device. A backside cavity 79' is present in the portion of each backside contact trench 79 that is not filled with the backside blocking dielectric layer and the continuous metallic material layer 46L. The remaining portions of the compositionally modulated sacrificial material layers 42 that are present at the processing steps of FIGS. 8A and 8B are replaced with the conductive material layers 46.

Figure 11:
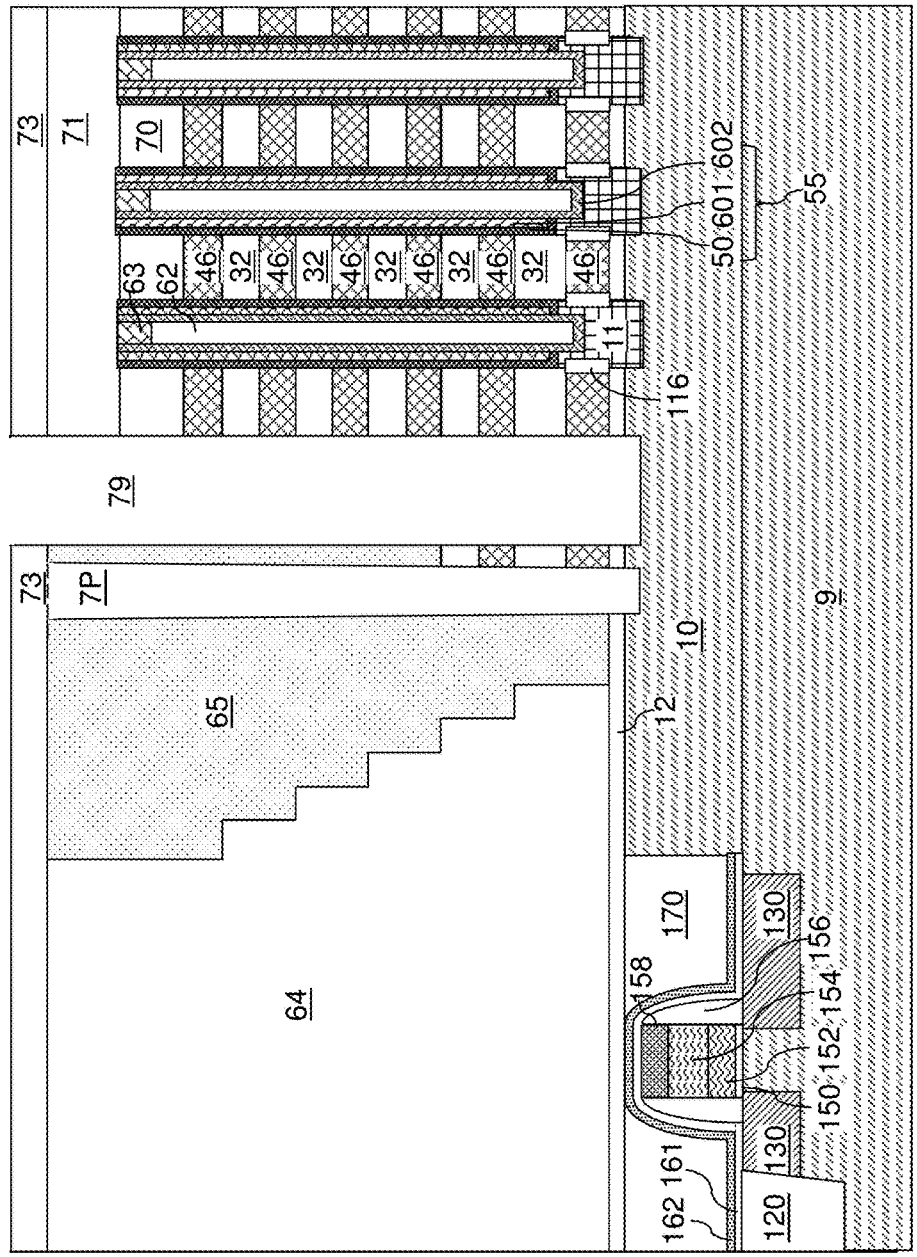
FIG. 11 is a vertical cross-sectional view of the exemplary structure after removal of a deposited conductive material from within the backside contact trench according to an embodiment of the present disclosure.
Figure 12:
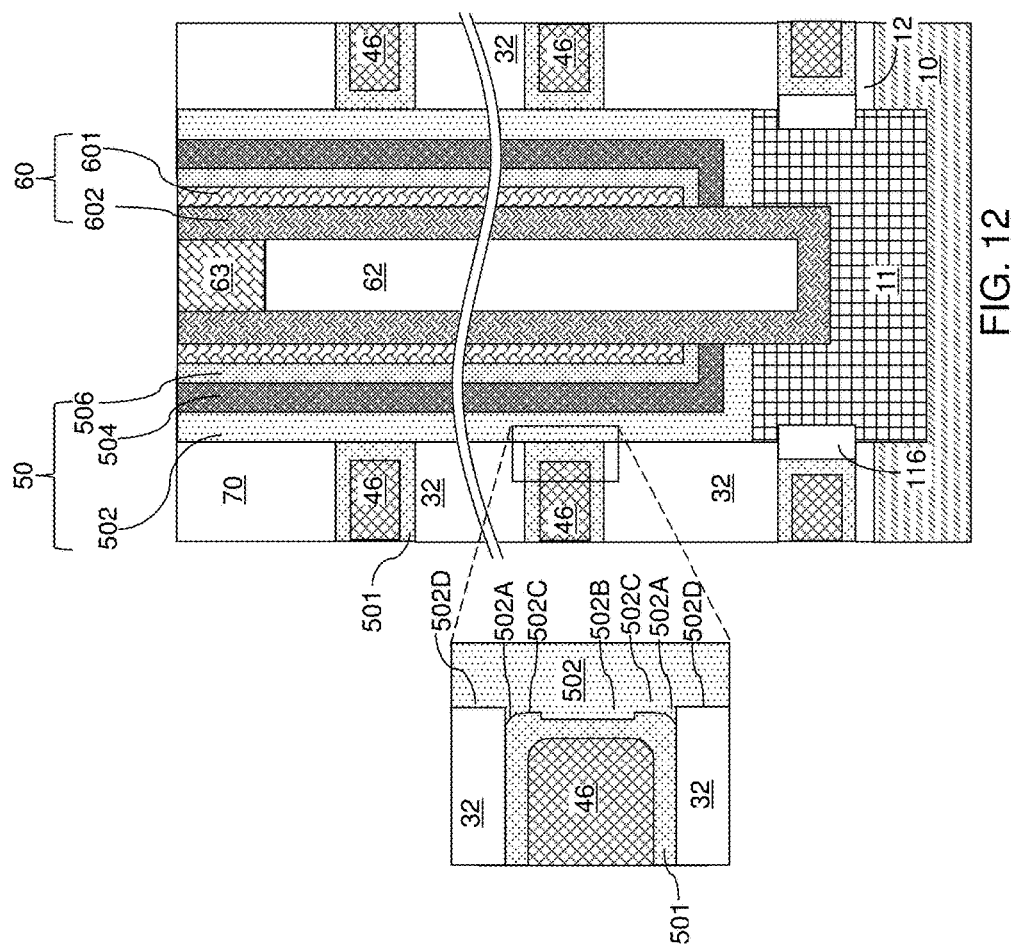
FIG. 12 is a magnified view of a memory stack structure within the exemplary structure of FIG. 11.

Referring to FIGS. 11 and 12, the deposited metallic material of the continuous metallic material layer 46L is etched back from the sidewalls of each backside contact trench 79 and from above the second contact level dielectric layer 73, for example, by an isotropic etch. Each remaining portion of the deposited metallic material in the backside recesses 43 constitutes an electrically conductive layer 46. Each electrically conductive layer 46 can be a conductive line structure. Thus, the compositionally modulated sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. Optionally, the sacrificial dielectric portions 616 can be removed from underneath the backside trenches 79 during the last processing step of the anisotropic etch. Each backside trench 79 extends through the alternating stack (32, 46) of the insulating layers 32 and the electrically conductive layers 46 and to the top surface of the substrate (9, 10).

As illustrated in the inset of FIG. 12, each silicon-oxide-containing blocking dielectric 502 can include laterally protruding portions 502A that contact a respective horizontal surface of the insulating layers 32. Each laterally protruding portion 502A of a silicon-oxide-containing blocking dielectric 502 can have an annular shape. Each silicon-containing blocking dielectric 502 can have two annular laterally protruding portions 502A per (i.e., facing) electrically conductive layer 46.

Figure 13:
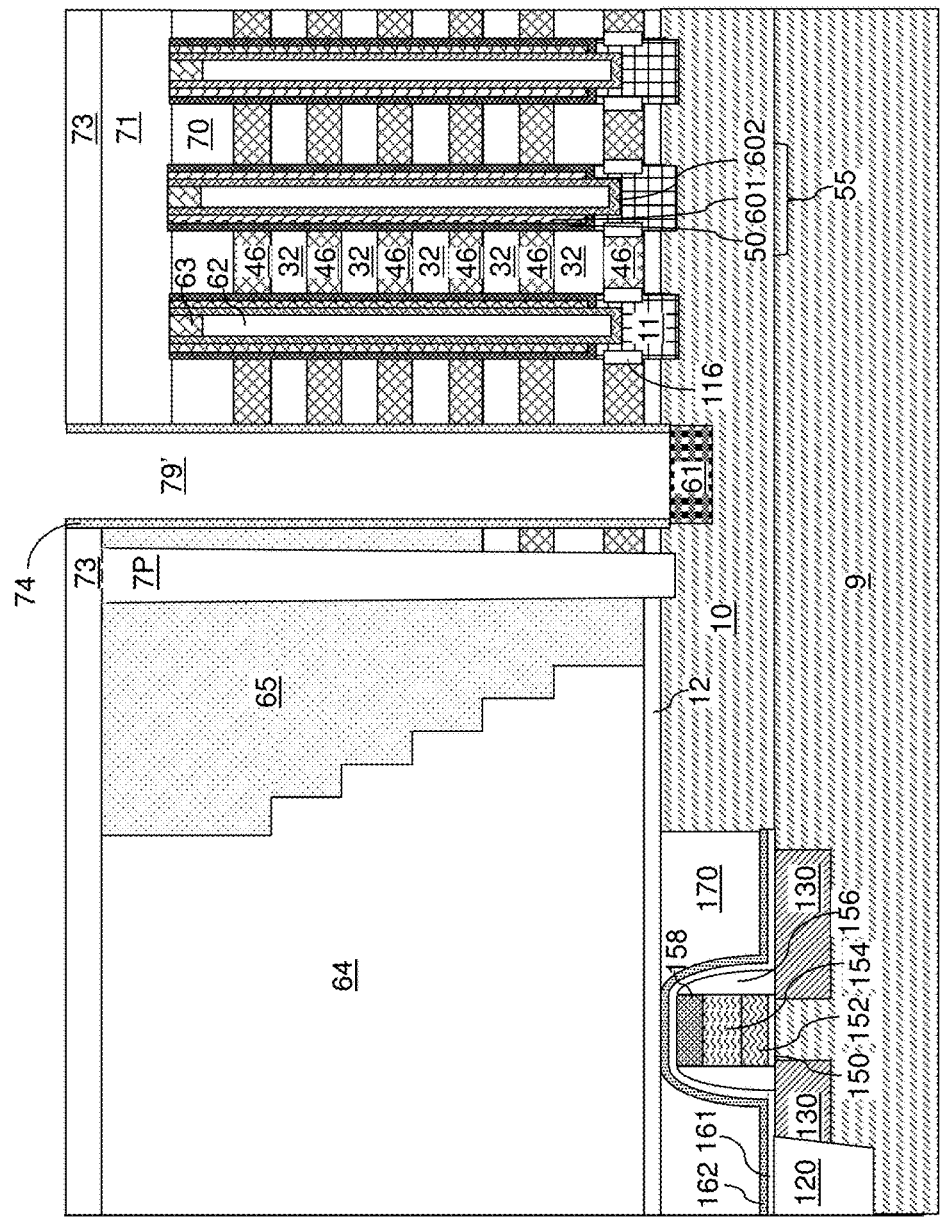
FIG. 13 is a vertical cross-sectional view of the exemplary structure after formation of an insulating spacer and a source region according to an embodiment of the present disclosure.

Referring to FIG. 13, an insulating material layer can be formed in each backside contact trench 79 and over the second contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. The thickness of the insulating material layer can be in a range from 1.5 nm to 60 nm, although lesser and greater thicknesses can also be employed.

Subsequently, an anisotropic etch is performed to remove horizontal portions of the insulating material layer and to optionally remove the horizontal portion of the backside blocking dielectric layer from above the second contact level dielectric layer 73. Each remaining portion of the insulating material layer inside a backside contact trench 79 constitutes a vertically elongated annular structure with a vertical cavity therethrough, which is herein referred to as an insulating spacer 74.

Each insulating spacer 74 can be formed over the sidewalls of the backside contact trench 79, and directly on the sidewalls of the electrically conductive layers 46, i.e., directly on the sidewalls of the metallic material portions 46. The thickness of each insulating spacer 74, as measured at a bottom portion thereof, can be in a range from 1.5 nm to 60 nm, although lesser and greater thicknesses can also be employed. In one embodiment, the thickness of the insulating spacer 74 can be in a range from 3 nm to 10 nm. Each insulating spacer 74 laterally surrounds a cavity, which is herein referred to as a backside cavity 79'. A top surface of a source region 61 (which is a doped semiconductor material portion) can be physically exposed at the bottom of each backside cavity 79' that is provided within an insulating spacer 74.

In one embodiment, source regions 61 can be formed in, or on, portions of the semiconductor substrate layer 10 underlying the backside trenches 79 by implantation of dopants of a second conductivity type (which is the opposite of the first conductivity type) after formation of the backside trenches 79. For example, if the first conductivity type is p-type, the second conductivity type is n-type, and vice versa. In one embodiment, an annular bottom surface of the insulating spacer 74 contacts a top surface of the source region 61.

Figure 14:
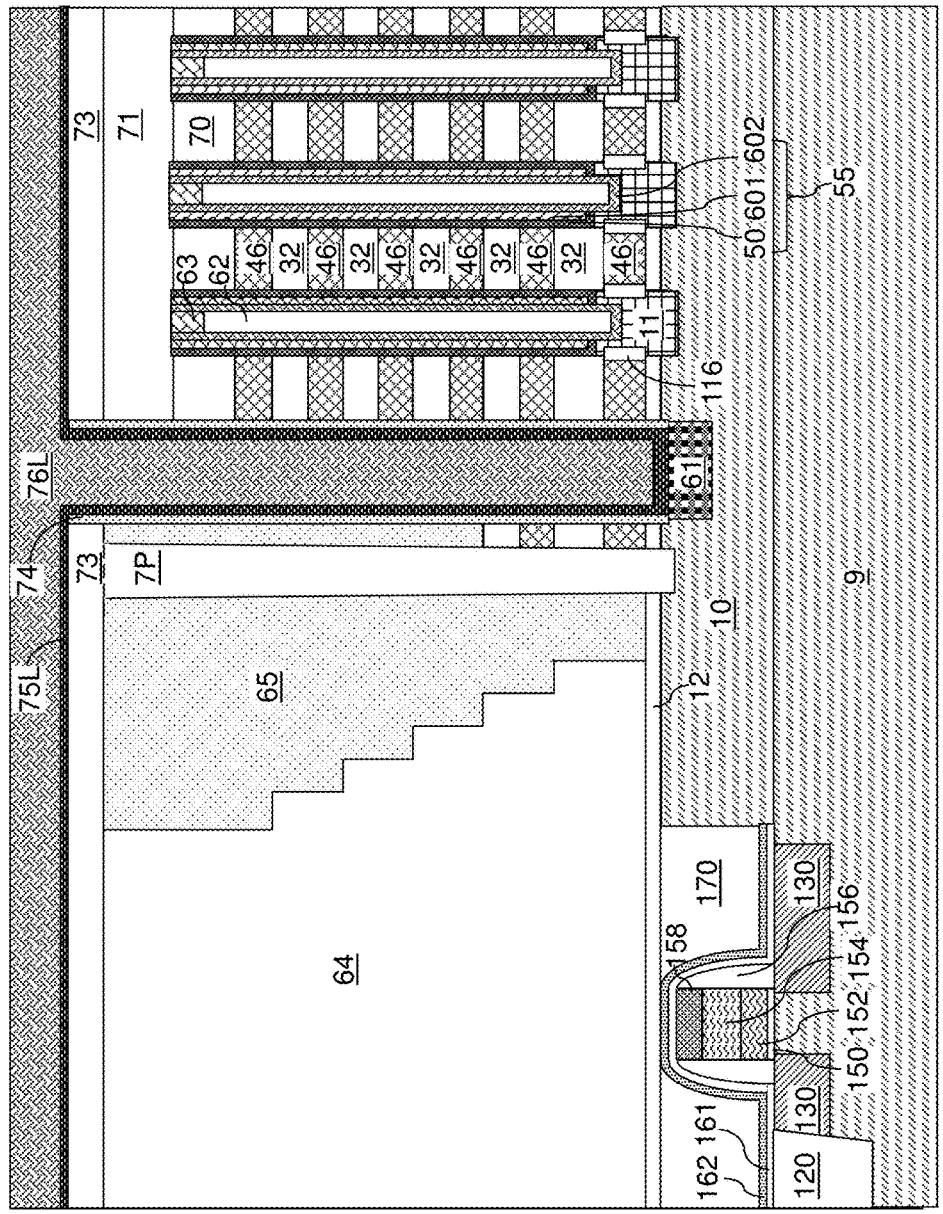
FIG. 14 is a vertical cross-sectional view of the exemplary structure after deposition of a metallic diffusion barrier layer and a conductive fill material layer according to an embodiment of the present disclosure.

Referring to FIG. 14, at least one conductive material layer can be deposited in each cavity in the backside trenches 79 and over the contact level dielectric layers (71, 73) employing one or more conformal deposition methods. The at least one conductive material layer can include, for example, a continuous metallic diffusion barrier layer 75L and a conductive fill material layer 76L.

The continuous metallic diffusion barrier layer 75L can include a metallic material that blocks diffusion of metals into the underlying semiconductor material (such as the semiconductor material of the source regions 61). For example, the continuous metallic diffusion barrier layer 75L can include a conductive metallic nitride such as TiN, TaN, and/or WN, and/or can include a conductive metallic carbide such as TiC, TaC, and/or WC. The thickness of the continuous metallic diffusion barrier layer 75L can be in a range from 2 nm to 20 nm, although lesser and greater thicknesses can also be employed.

The conductive fill material layer 76L can include an elemental metal or an intermetallic alloy of at least two metals. For example, the conductive fill material layer 76L can include W, Co, Ru, Al, Cu, or a combination or an alloy thereof.

Figure 15:
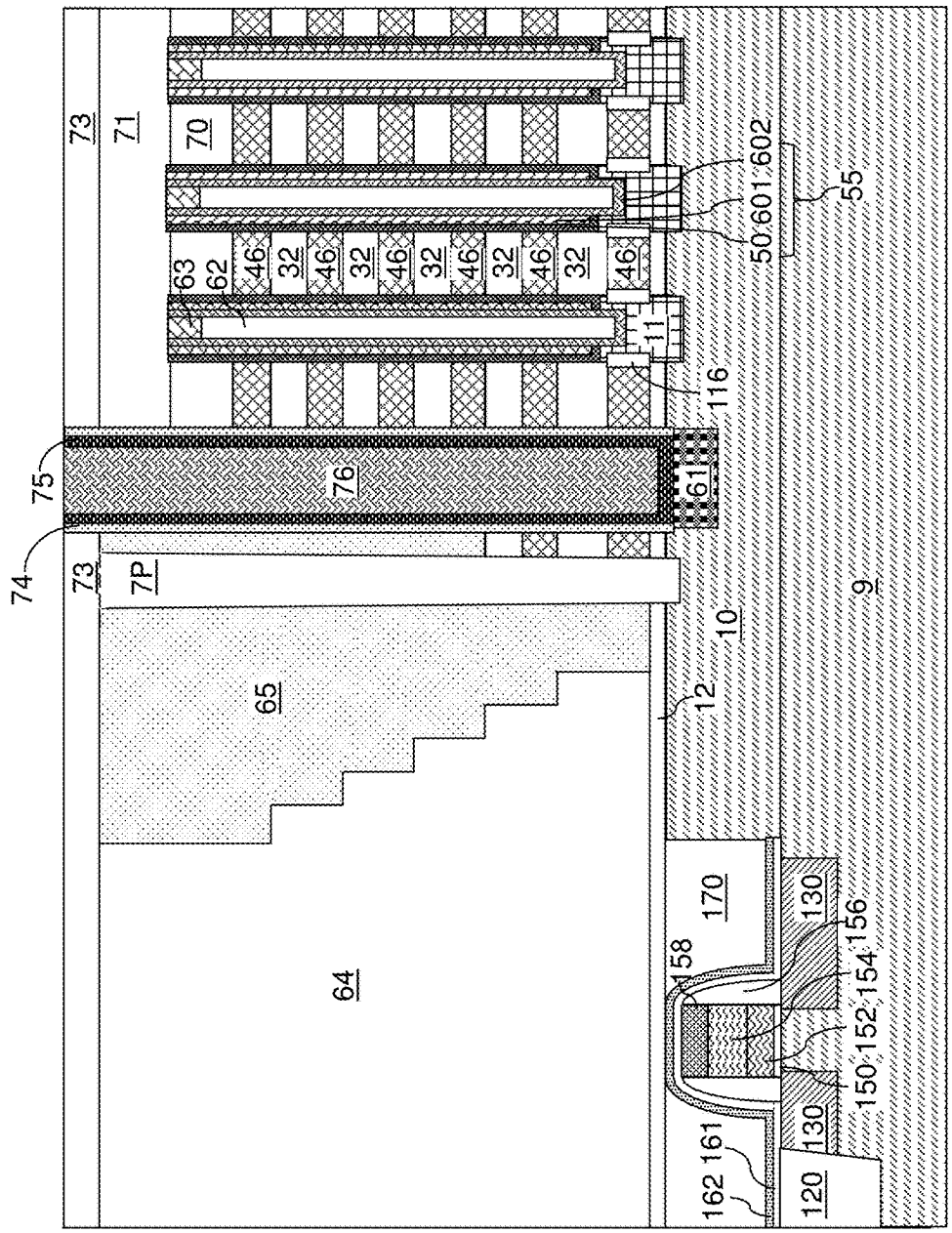
FIG. 15 is a vertical cross-sectional view of the exemplary structure after a planarization process that forms a contact via structure according to an embodiment of the present disclosure.

Referring to FIG. 15, excess portions of the conductive fill material layer 76L and the continuous metallic diffusion barrier layer 75L can be remove from above a horizontal plane including the top surface of the contact level dielectric layers (71, 73) by a planarization process. For example, a recess etch or chemical mechanical planarization can be employed for the planarization process. The top surface of the contact level dielectric layers (71, 73) can be employed as the stopping layer for the planarization process. Each remaining portion of the conductive fill material layer 76L constitutes a conductive fill material portion 76. Each remaining portion of the continuous metallic diffusion barrier layer 75L constitutes a metallic diffusion barrier portion 75. Each conductive fill material portion 76 can be embedded in a metallic diffusion barrier layer 75. Each contact via structure (75, 76) can be a source contact via structure that contacts a respective source region 61.

Figure 16:
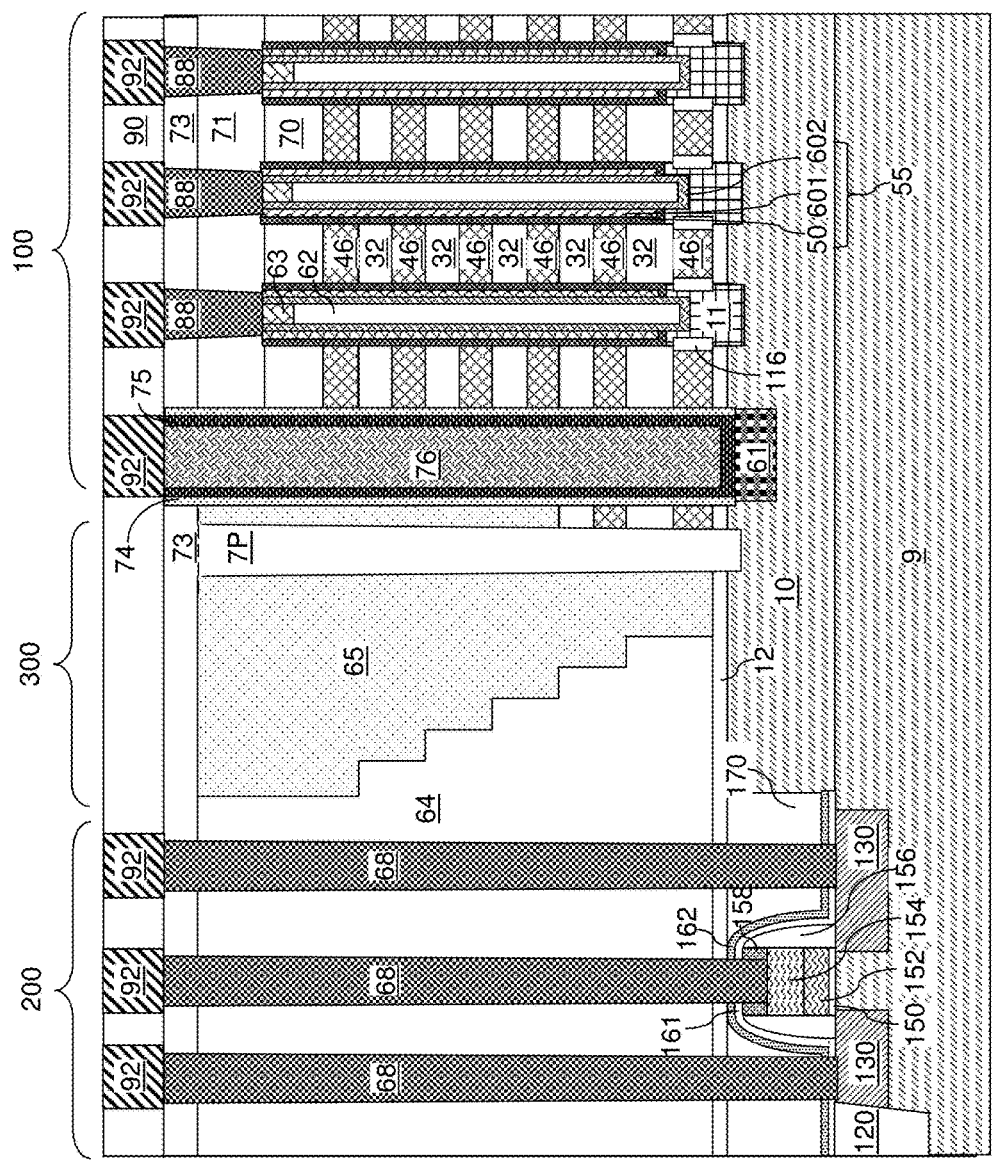
FIG. 16 is a vertical cross-sectional view of the exemplary structure after formation of additional contact via structures, a line-level dielectric layer, and metal lines according to an embodiment of the present disclosure.

Referring to FIG. 16, a photoresist layer (not shown) can be applied over the topmost layer of the exemplary structure (which can be, for example, the second contact level dielectric layer 73), and is lithographically patterned to form various openings in the device region 100, the peripheral device region 200, and the contact region 300. The locations and the shapes of the various openings are selected to correspond to electrical nodes of the various devices to be electrically contacted by contact via structures. In one embodiment, a single photoresist layer may be employed to pattern all openings that correspond to the contact via cavities to be formed, and all contact via cavities can be simultaneously formed by at least one anisotropic etch process that employs the patterned photoresist layer as an etch mask. In another embodiment, a plurality of photoresist layers may be employed in combination with a plurality of anisotropic etch processes to form different sets of contact via cavities with different patterns of openings in the photoresist layers. The photoresist layer(s) can be removed after a respective anisotropic etch process that transfers the pattern of the openings in the respective photoresist layer through the underlying dielectric material layers and to a top surface of a respective electrically conductive structure.

In an illustrative example, drain contact via cavities can be formed over each memory stack structure 55 in the device region 100 such that a top surface of a drain region 63 is physically exposed at the bottom of each drain contact via cavity. Word line contact via cavities can be formed to the stepped surfaces of the alternating stack (32, 46) such that a top surface of an electrically conductive layer 46 is physically exposed at the bottom of each word line contact via cavity in the contact region 300. A device contact via cavity can be formed to each electrical node of the peripheral devices to be contacted by a contact via structure in the peripheral device region.

The various via cavities can be filled with at least one conductive material, which can be a combination of an electrically conductive metallic liner material (such as TiN, TaN, or WN) and a metallic fill material (such as W, Cu, or Al). Excess portions of the at least one conductive material can be removed from above the at least one contact level dielectric layer (71, 73) by a planarization process, which can include, for example, chemical mechanical planarization (CMP) and/or a recess etch. Drain contact via structures 88 can be formed on the respective drain regions 63. Word line contact via structures (not shown) can be formed on the respective electrically conductive layers 46. Peripheral device contact via structures 68 can be formed on the respective nodes of the peripheral devices.

Additional metal interconnect structures including at least one dielectric material layers and metal lines 92 (e.g., bit lines) can be formed over the exemplary structure to provide electrical wiring among the various contact via structures.

For example, the at least one dielectric material layer can include a line-level dielectric layer 90 in which the metal lines 92 can be formed.

Each of the at least one memory stack structure 55 can comprises, from inside to outside, a semiconductor channel 60; a tunneling dielectric 506 laterally surrounding the semiconductor channel 60; a vertical stack of charge storage regions (as embodied by discrete portions of the memory material layer 504 located at each level of the electrically conductive layers 46) laterally surrounding the tunneling dielectric 506; and the blocking dielectric 502.

In one embodiment, the exemplary structure can include a three-dimensional memory device that comprises a vertical NAND device formed in a device region 100. The electrically conductive layers 46 can comprise, or can be electrically connected to, a respective word line of the NAND device. The device region 100 can comprise a plurality of semiconductor channels 60. At least one end portion of each of the plurality of semiconductor channels 60 extends substantially perpendicular to a top surface of the substrate (9, 10). The device region 100 can further include a plurality of charge storage regions as embodied as portions of the memory material layer 504. Each charge storage region can be located adjacent to a respective one of the plurality of semiconductor channels 60. A plurality of control gate electrodes (as embodied by portions of the electrically conductive layers 46 that are adjacent to the memory stack structures 55) can have a strip shape extending substantially parallel to the top surface of the substrate (9, 10). The plurality of control gate electrodes can comprise at least a first control gate electrode located in a first device level and a second control gate electrode located in a second device level. The electrically conductive layers 46 in the alternating stack (32, 46) can be in electrical contact with the plurality of control gate electrodes and extend from the device region 100 to a contact region 300 including a plurality of electrically conductive via connections (which are contact via structures that contact the electrically conductive layers 46 in the contact region 300). In one embodiment, the substrate (9, 10) can comprise a silicon substrate containing a driver circuit for the NAND device (which may be provided in the peripheral device region 200).

As discussed above the use of compositionally modulated sacrificial material layers to form the three dimensional NAND device may achieve a larger control gate 46 width (i.e., height in a direction perpendicular to the top substrate surface 7) due to smaller bird's beak shaped protruding portions 502A of the blocking dielectric than the protruding portions 1502A in the prior art device of FIG. 4B. The larger control gate 46 width can improve device data retention and programming characteristics. Specifically, the device threshold voltage shift may be improved because one-electron sensitivity of wider control gates (larger capacitance) is smaller than that of narrower gates (smaller capacitance). Furthermore, the wider gate length provides faster programming with its higher natural threshold voltage, which improves the device program characteristics. Finally, natural 12-sigma threshold voltage width will become narrower because process variation related effect will be smaller. Narrower 12-sigma threshold voltage width may lead to faster program speed because programming voltage increment step can be larger.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of manufacturing a memory device, comprising:
   forming an alternating stack comprising insulating layers and compositionally modulated sacrificial material layers over a substrate, wherein each of the compositionally modulated sacrificial material layers has a vertical modulation of material composition;
   forming a memory opening through the alternating stack;
   depositing a silicon-containing material liner on a sidewall of the memory opening;
   converting the silicon-containing material liner into a silicon-oxide-containing blocking dielectric employing an oxidation process, wherein each of the compositionally modulated sacrificial material layers provides greater resistance to conversion into a silicon-oxide-containing material at upper and lower portions thereof than at a middle portion thereof; and
   forming a memory stack structure including the silicon-oxide-containing blocking dielectric in the memory opening.

2. The method of claim 1, wherein each of the compositionally modulated sacrificial material layers comprises a layer stack of silicon nitride layers having different atomic ratios of nitrogen atoms to silicon atoms.

3. The method of claim 1, wherein each of the compositionally modulated sacrificial material layers comprises a layer stack including, from bottom to top, a lower silicon-rich silicon nitride layer, a base-stoichiometry silicon nitride layer, and an upper silicon-rich silicon nitride layer.

4. The method of claim 3, wherein each of the lower and upper silicon-rich silicon nitride layers has an atomic ratio between nitrogen atoms and silicon atoms that is in a range from 2/3 to 1.3.

5. The method of claim 3, wherein the base-stoichiometry silicon nitride layer is a substantially stoichiometric silicon nitride layer.

6. The method of claim 5, wherein each of the lower and upper silicon-rich silicon nitride layers has a thickness that is in a range from 5% to 40% of a total thickness of the lower silicon-rich silicon nitride layer, the substantially stoichiometric silicon nitride layer, and the upper silicon-rich silicon nitride layer.

7. The method of claim 1, wherein each of the compositionally modulated sacrificial material layers is formed by a plasma assisted chemical vapor deposition (PECVD) process including multiple deposition steps, wherein a ratio of a silicon precursor gas and a nitrogen-containing gas is modulated during each deposition step in the plasma assisted chemical vapor deposition process.

8. The method of claim 7, wherein:
   the compositionally modulated sacrificial material layers comprise compositionally modulated silicon nitride layers;
   the silicon precursor gas is selected from silane, disilane, dichlorosilane, and trichlorisilane; and
   the nitrogen-containing gas is ammonia.

9. The method of claim 1, wherein the silicon-containing material liner comprises a silicon nitride liner.

10. The method of claim 9, wherein the silicon-containing material liner is converted into a silicon-oxide-containing blocking dielectric by a process selected from a thermal oxidation process and a plasma oxidation process.

11. The method of claim 9, wherein the silicon-containing material liner is converted into a silicon-oxide-containing blocking dielectric by an in-situ steam generation oxidation process.

12. The method of claim 9, wherein the silicon-oxide-containing blocking dielectric comprises a material selected from a stoichiometric silicon dioxide and silicon oxynitride.

13. The method of claim 1, wherein the memory stack structure is formed by:
   forming charge storage regions over the silicon-oxide-containing blocking dielectric;
   forming a tunneling dielectric over the charge storage regions; and
   forming a semiconductor channel over the tunneling dielectric.

14. The method of claim 1, wherein interfacial portions of the compositionally modulated sacrificial material layers in physical contact with the insulating layers are converted into portions of the silicon-oxide-containing material having a bird's beak shape.

15. The method of claim 14, wherein the insulating layers comprise silicon oxide, and oxygen atoms diffuse through the insulating layers into surface portions of the compositionally modulated sacrificial material layers during conversion of the silicon-containing material liner into the silicon-oxide-containing blocking dielectric.

16. The method of claim 13, wherein the protruding portions of the silicon-oxide-containing blocking dielectric having the bird's beak shape comprise laterally protruding portions that contact a respective horizontal surface of the insulating layers.

17. The method of claim 16, further comprising:
   forming a backside trench through the alternating stack;
   forming backside recesses by removing remaining portions of the sacrificial material layers selective to the insulating layers and the memory stack structure employing an etch process that supplies an etchant through the backside trench;
   forming outer blocking dielectrics in the backside recesses; and
   forming electrically conductive layers over the respective outer blocking dielectrics in the backside recesses.

18. The method of claim 17, wherein the silicon-oxide-containing blocking dielectric further comprises:
   a protrusion that extends into a middle of each outer blocking dielectric;
   first recesses located between the protrusion and the laterally protruding portions; and
   second recesses located between the laterally protruding portions in adjacent device levels and adjacent to the respective insulating layers.

19. The method of claim 17, wherein:
   the structure comprises a three-dimensional memory device that comprises a vertical NAND device formed in a device region;
   the electrically conductive layers comprise, or are electrically connected to, a respective word line of the NAND device;
   the device region comprises:
      a plurality of semiconductor channels, wherein at least one end portion of each of the plurality of semiconductor channels extends substantially perpendicular to a top surface of the substrate;

a plurality of charge storage regions, each charge storage region located adjacent to a respective one of the plurality of semiconductor channels; and a plurality of control gate electrodes having a strip shape extending substantially parallel to the top surface of the substrate;

the plurality of control gate electrodes comprise at least a first control gate electrode located in a first device level and a second control gate electrode located in a second device level;

the electrically conductive layers in the alternating stack are in electrical contact with the plurality of control gate electrodes and extend from the device region to a contact region including a plurality of electrically conductive via connections; and the substrate comprises a silicon substrate containing a driver circuit for the NAND device.

20. A three-dimensional memory device comprising:

an alternating stack of electrically conductive layers and insulating layers located over a substrate;

outer blocking dielectrics located adjacent to the respective electrically conductive layers; and an array of memory stack structures, each memory stack structure extending through the alternating stack and including a memory film and a semiconductor channel laterally surrounded by the memory film;

wherein:

the memory film comprises a tunneling dielectric surrounding the semiconductor channel, a charge storage dielectric layer surrounding the tunneling dielectric, and an inner silicon-oxide-containing blocking dielectric surrounding the charge storage dielectric layer; and the inner silicon-oxide-containing blocking dielectric comprises:

laterally protruding portions having a bird's beak shape that contact a respective horizontal surface of the insulating layers;

a protrusion that extends into a middle of each outer blocking dielectric;

first recesses located between the protrusion and the laterally protruding portions; and second recesses located between the laterally protruding portions in adjacent device levels and adjacent to the respective insulating layers.

21. The device of claim 20, wherein:

the three-dimensional memory device comprises a vertical NAND device formed in a device region;

the electrically conductive layers comprise, or are electrically connected to, a respective word line of the NAND device;

the device region comprises:

a plurality of semiconductor channels, wherein at least one end portion of each of the plurality of semiconductor channels extends substantially perpendicular to a top surface of the substrate;

a plurality of charge storage regions, each charge storage region located adjacent to a respective one of the plurality of semiconductor channels; and a plurality of control gate electrodes having a strip shape extending substantially parallel to the top surface of the substrate;

the plurality of control gate electrodes comprise at least a first control gate electrode located in a first device level and a second control gate electrode located in a second device level;

the electrically conductive layers in the alternating stack are in electrical contact with the plurality of control gate electrodes and extend from the device region to a contact region including a plurality of electrically conductive via connections; and the substrate comprises a silicon substrate containing a driver circuit for the NAND device.

22. A three-dimensional memory device comprising:

an alternating stack of first layers and insulating layers located over a substrate; and an array of memory stack structures, each memory stack structure extending through the alternating stack and including a memory film and a semiconductor channel laterally surrounded by the memory film;

wherein the first layers comprise electrically conductive layers in a device region of the device and a stack of silicon nitride layers having different atomic ratios of nitrogen atoms to silicon atoms in at least one other region of the device.

23. The device of claim 22, wherein:

the three-dimensional memory device comprises a vertical NAND device formed in the device region;

the electrically conductive layers comprise, or are electrically connected to, a respective word line of the NAND device;

the device region comprises:

a plurality of semiconductor channels, wherein at least one end portion of each of the plurality of semiconductor channels extends substantially perpendicular to a top surface of the substrate;

a plurality of charge storage regions, each charge storage region located adjacent to a respective one of the plurality of semiconductor channels; and a plurality of control gate electrodes having a strip shape extending substantially parallel to the top surface of the substrate;

the plurality of control gate electrodes comprise at least a first control gate electrode located in a first device level and a second control gate electrode located in a second device level;

the electrically conductive layers in the alternating stack are in electrical contact with the plurality of control gate electrodes and extend from the device region to a contact region including a plurality of electrically conductive via connections; and the substrate comprises a silicon substrate containing a driver circuit for the NAND device.

* * * * *